US011789096B2

(12) United States Patent
Kikitsu et al.

(10) Patent No.: US 11,789,096 B2
(45) Date of Patent: Oct. 17, 2023

(54) SENSOR AND INSPECTION DEVICE

(71) Applicant: KABUSHIKI KAISHA TOSHIBA, Tokyo (JP)

(72) Inventors: Akira Kikitsu, Yokohama Kanagawa (JP); Yoshihiro Higashi, Komatsu Ishikawa (JP); Satoshi Shirotori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/875,044

(22) Filed: Jul. 27, 2022

(65) Prior Publication Data
US 2023/0266410 A1 Aug. 24, 2023

(30) Foreign Application Priority Data

Feb. 21, 2022 (JP) ................... 2022-024482

(51) Int. Cl.
*G01R 33/09* (2006.01)
*H01F 7/02* (2006.01)
(52) U.S. Cl.
CPC ............... *G01R 33/09* (2013.01); *H01F 7/02* (2013.01)
(58) Field of Classification Search
CPC ................................................. G01R 33/09
See application file for complete search history.

(56) References Cited

U.S. PATENT DOCUMENTS

2015/0247884 A1* 9/2015 Ogimoto ............ G01R 33/093
324/252
2017/0363606 A1 12/2017 Kikitsu et al.
2018/0271395 A1 9/2018 Iwasaki et al.
2019/0369172 A1* 12/2019 Kikitsu ............ G01R 33/0023
2020/0319269 A1* 10/2020 Shirotori ............ G01R 33/0011
2022/0065955 A1 3/2022 Kikitsu et al.

FOREIGN PATENT DOCUMENTS

| JP | 2002-277522 A | 9/2002 |
| JP | 2005-315812 A | 11/2005 |
| JP | 2015-197388 A | 11/2015 |
| JP | 2018-155719 A | 10/2018 |
| JP | 2019-207167 A | 12/2019 |
| JP | 6668176 B2 | 3/2020 |
| JP | 2022-37688 A | 3/2022 |

* cited by examiner

*Primary Examiner* — Alesa Allgood
(74) *Attorney, Agent, or Firm* — Finnegan, Henderson, Farabow, Garrett & Dunner, LLP

(57) ABSTRACT

According to one embodiment, a sensor includes a first element. The first element includes first and second magnetic members, an insulating member, first and second wirings, a first magnetic element, and a first conductive member. The second magnetic member is separated from the first magnetic member. The insulating member includes a first insulating region. The first insulating region is provided between the first and second magnetic members. The first wiring includes a first connecting region. The second wiring includes a second connecting region. The first magnetic element includes a first magnetic layer and a first opposed magnetic layer. The first magnetic element includes first to fifth partial regions. The first partial region is between the fourth and fifth partial regions. The second partial region is between the fourth and first partial region. The third partial region is between the first and fifth partial regions.

20 Claims, 17 Drawing Sheets

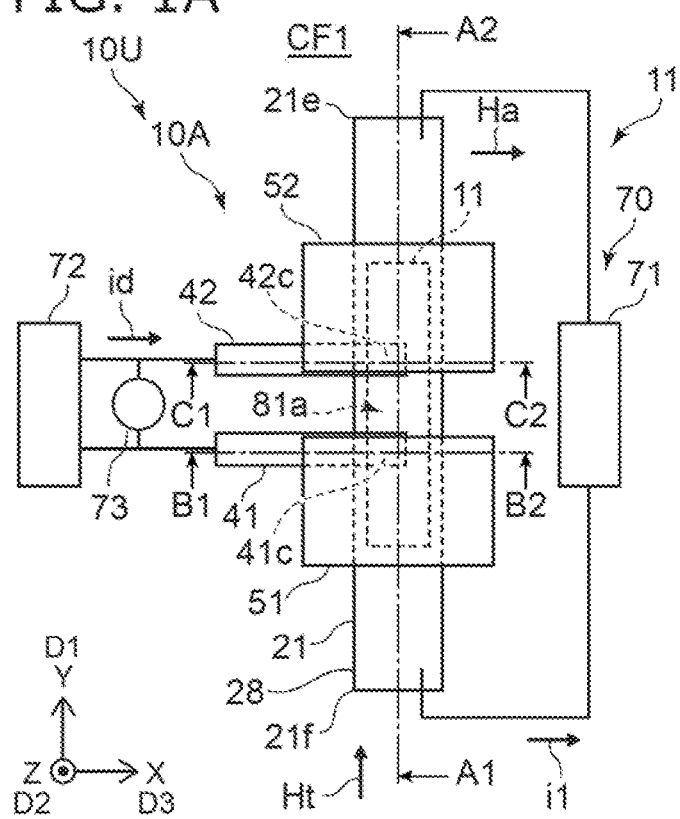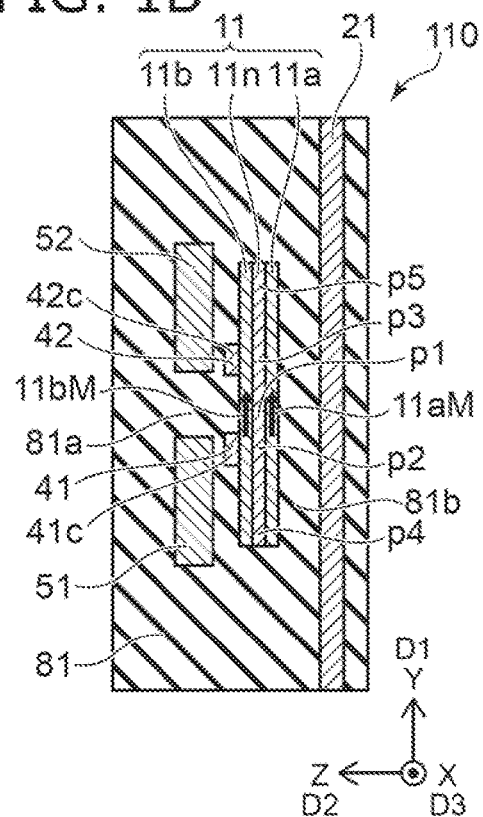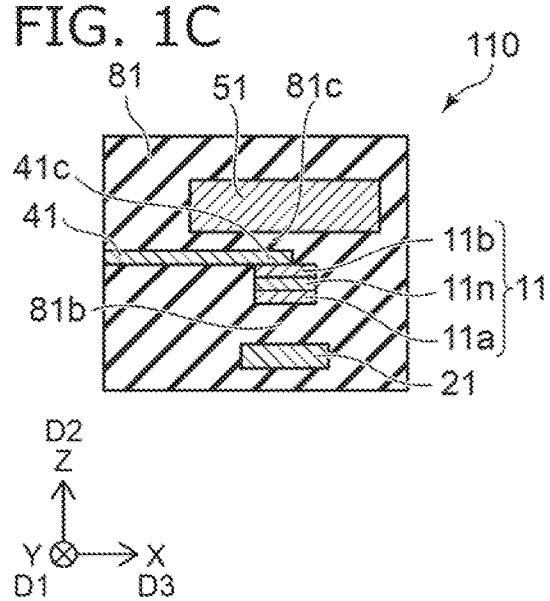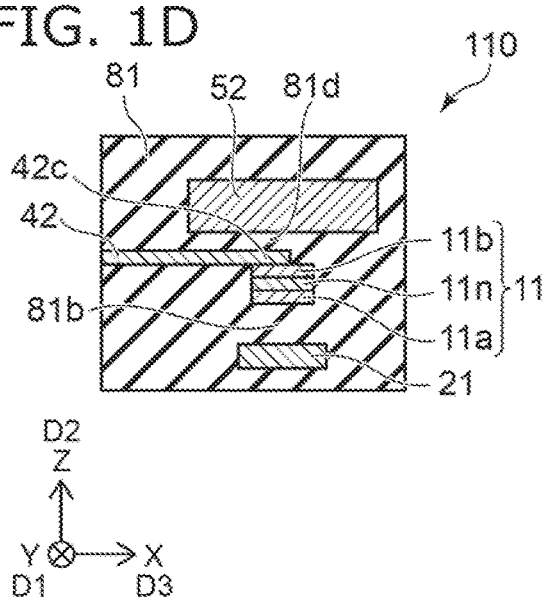

SENSOR AND INSPECTION DEVICE

CROSS-REFERENCE TO RELATED APPLICATIONS

This application is based upon and claims the benefit of priority from Japanese Patent Application No. 2022-024482, filed on Feb. 21, 2022; the entire contents of which are incorporated herein by reference.

FIELD

Embodiments of the invention generally relate to a sensor and an inspection device.

BACKGROUND

For example, there is a sensor that uses a magnetic layer. It is desired to improve the characteristics of the sensor.

BRIEF DESCRIPTION OF THE DRAWINGS

FIGS. 1A to 1D are schematic views illustrating a sensor according to a first embodiment.

DETAILED DESCRIPTION

Figure 2A:
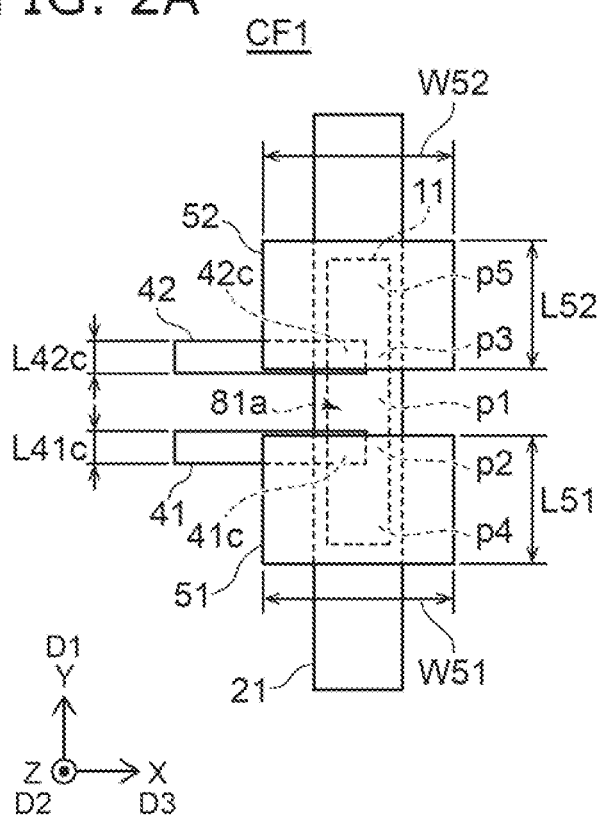
FIGS. 2A to 2C are schematic views illustrating the sensor according to the first embodiment.

According to one embodiment, a sensor includes a first element. The first element includes a first magnetic member, a second magnetic member, an insulating member, a first wiring, a second wiring, a first magnetic element, and a first conductive member. The second magnetic member is separated from the first magnetic member in a first direction from the first magnetic member to the second magnetic member. The insulating member includes a first insulating region. The first insulating region is provided between the first magnetic member and the second magnetic member. The first wiring includes a first connecting region. The second wiring includes a second connecting region. The first magnetic element includes a first magnetic layer and a first opposed magnetic layer. A second direction from the first magnetic layer to the first opposed magnetic layer crosses the first direction. A length of the first magnetic element along the first direction is longer than a length of the first magnetic element along a third direction crossing a plane including the first direction and the second direction. The first magnetic element includes a first partial region, a second partial region, a third partial region, a fourth partial region, and a fifth partial region. The first partial region is between the fourth partial region and the fifth partial region in the first direction. The second partial region is between the fourth partial region and the first partial region in the first direction. The third partial region is between the first partial region and the fifth partial region in the first direction. A direction from the first partial region to the first insulating region is along the second direction. A direction from the second partial region to the first connecting region is along the second direction. The second partial region is electrically connected to the first connecting region. A direction from the third partial region to the second connecting region is along the second direction. The third partial region is electrically connected to the second connecting region. A direction from the fourth partial region to at least a part of the first magnetic member is along the second direction. A direction from the fifth partial region to at least a part of the second magnetic member is along the second direction. The first conductive member extends in the first direction. A direction from the first conductive member to the first magnetic element is along the second direction.

According to one embodiment, a sensor includes a first element. The first element includes a first magnetic member, a second magnetic member, an insulating member, a first wiring, a second wiring, a first magnetic element, and a first conductive member. The second magnetic member is separated from the first magnetic member in a first direction from the first magnetic member to the second magnetic member. The insulating member includes a first insulating region. The first insulating region is provided between the first magnetic member and the second magnetic member. The first wiring includes a first connecting region. The second wiring includes a second connecting region. The first magnetic element includes a first magnetic layer and a first opposed magnetic layer. A second direction from the first magnetic layer to the first opposed magnetic layer crosses the first direction. A length of the first magnetic element along the first direction is longer than a length of the first magnetic element along a third direction crossing a plane including the first direction and the second direction. The first magnetic element includes a first partial region. A direction from the first partial region to the first insulating region is along the second direction. The first connecting region is electrically connected to a part of the first partial region. The second connecting region is electrically connected to an other part of the first partial region. A direction from the part of the first partial region to the other part of the first partial region includes a component of the third direction. The first conductive member extends in the first direction. A direction from the first conductive member to the first magnetic element is along the second direction.

According to one embodiment, a sensor includes a first element. The first element includes a first magnetic member, a second magnetic member, an insulating member, a first wiring, a second wiring, a first magnetic element, and a first conductive member. The second magnetic member is separated from the first magnetic member in a first direction from the first magnetic member to the second magnetic member. The insulating member includes a first insulating region. The first insulating region is provided between the first magnetic member and the second magnetic member. The first wiring includes a first connecting region. The second wiring includes a second connecting region. The first magnetic element includes a first magnetic layer and a first opposed magnetic layer. A second direction from the first magnetic layer to the first opposed magnetic layer crosses the first direction. A length of the first magnetic element along the first direction is longer than a length of the first magnetic element along a third direction crossing a plane including the first direction and the second direction. The first magnetic element includes a first partial region. The first partial region is between the second connecting region and the first insulation region. The first connecting region is between the first partial region and the first insulation region. The first connecting region is electrically connected to one of the first magnetic layer and the first opposed magnetic layer. The second connecting region is electrically connected to an other of the first magnetic layer and the first opposed magnetic layer. The first conductive member extends in the first direction. A direction from the first conductive member to the first magnetic element is along the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1A to 1D are schematic views illustrating a sensor according to a first embodiment.

FIG. 1A is a plan view. FIG. 1B is a sectional view taken along line A1-A2 of FIG. 1A. FIG. 1C is a sectional view taken along line B1-B2 of FIG. 1A. FIG. 1D is a cross-sectional view taken along the line C1-C2 of FIG. 1A.

Figure 2B:
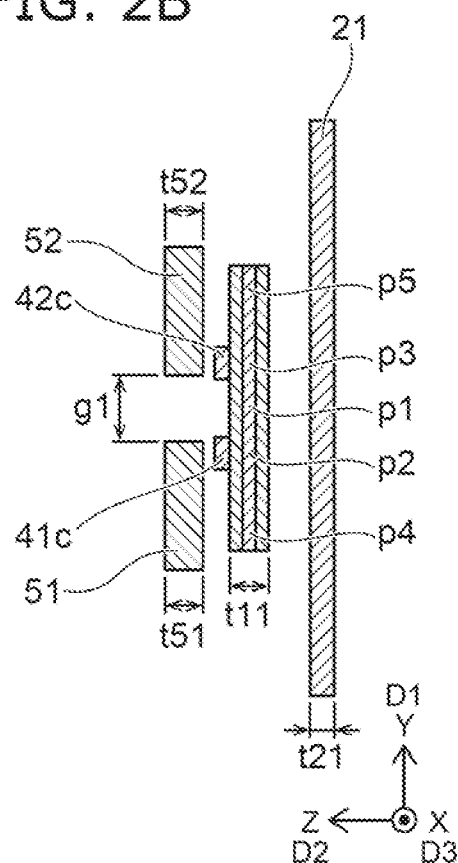
Figure 2C:
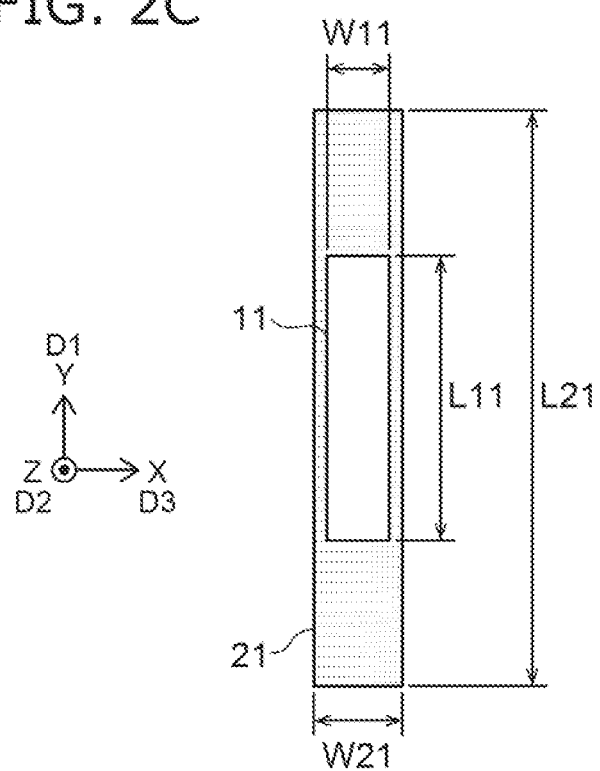

FIGS. 2A to 2C are schematic views illustrating the sensor according to the first embodiment;

FIG. 2A is plan views. FIG. 2B is a cross-sectional view corresponding to the A1-A2 line cross section of FIG. 1A. In these figures, some elements are extracted and drawn so that the figures are easy to see.

As shown in FIG. 1A, a sensor 110 according to the embodiment includes a first element 10A. The first element 10A may be included in the element portion 10U. The first element 10A includes a first magnetic member 51, a second magnetic member 52, an insulating member 81, a first wiring 41, a second wiring 42, a first magnetic element 11, and a first conductive member 21.

A first direction D1 from the first magnetic member 51 to the second magnetic member 52 is a Y-axis direction. One direction perpendicular to the Y-axis direction is defined as a Z-axis direction. The direction perpendicular to the Y-axis direction and the Z-axis direction is defined as an X-axis direction.

The second magnetic member 52 is separated from the first magnetic member 51 in the first direction D1.

The insulating member 81 includes a first insulating region 81a. The first insulating region 81a is provided between the first magnetic member 51 and the second magnetic member 52.

The first wiring 41 includes a first connecting region 41c. The second wiring 42 includes a second connecting region 42c.

The first magnetic element 11 includes a first magnetic layer 11a and a first opposed magnetic layer 11b. A second direction D2 from the first magnetic layer 11a to the first opposed magnetic layer 11b crosses the first direction D1. The second direction D2 is, for example, the Z-axis direction.

In this example, the first magnetic element 11 includes a first non-magnetic layer 11n. The first non-magnetic layer 11n is provided between the first magnetic layer 11a and the first opposed magnetic layer 11b. In this example, the first non-magnetic layer 11n is conductive. The first non-magnetic layer 11n includes, for example, at least one selected from the group consisting of Cu, Au and Ag.

As shown in FIG. 2C, a length of the first magnetic element 11 along the first direction D1 is defined as a length L11. A length (width) of the first magnetic element 11 along a third direction D3 is defined as a length W11. The third direction D3 crosses a plane including the first direction D1 and the second direction D2. The third direction D3 is, for example, the X-axis direction. The length L11 is longer than the length W11.

For example, when an external magnetic field is not applied, the magnetization 11aM of the first magnetic layer 11a (see FIG. 1B) is along the first direction D1. When no external magnetic field is applied, the magnetization 11bM of the first opposed magnetic layer 11b (see FIG. 1B) is along the first direction D1. These magnetizations may be based on, for example, the shape anisotropy of the magnetic layer. The first direction D1 is along, for example, the easy axis of magnetization of the magnetic layer. The third direction D3 is, for example, along the magnetizing difficult axis of the magnetic layer.

The length L11 is, for example, not less than 1 μm and not more than 10 mm. The length W11 is, for example, not less than nm and not more than 100 μm.

The first magnetic element 11 includes a first partial region p1, a second partial region p2, a third partial region p3, a fourth partial region p4, and a fifth partial region p5. As shown in FIGS. 1B, 2A and 2B, the first partial region p1 is located between the fourth partial region p4 and the fifth partial region p5 in the first direction D1. The second partial region p2 is located between the fourth partial region p4 and the first partial region p1 in the first direction D1. The third partial region p3 is located between the first partial region p1 and the fifth partial region p5 in the first direction D1. The boundaries between these multiple partial regions may be unclear.

As shown in FIG. 2B, a direction from the first partial region p1 to the first insulating region 81a is along the second direction D2. A direction from the second partial region p2 to the first connecting region 41c is along the second direction D2. The second partial region p2 is electrically connected to the first connecting region 41c. A direction from the third partial region p3 to the second connecting region 42c is along the second direction D2. The third partial p3 is electrically connected to the second connecting region 42c. A direction from the fourth partial region p4 to at least a part of the first magnetic member 51 is along the second direction D2. A direction from the fifth partial region p5 to at least a part of the second magnetic member 52 is along the second direction D2.

In the second direction D2, the region overlapping the region between the first magnetic member 51 and the second magnetic member 52 corresponds to the first partial region p1. In the second direction D2, the region overlapping the first connecting region 41c corresponds to the second partial region p2. In the second direction D2, the region overlapping the second connecting region 42c corresponds to the third partial region p3. In the second direction D2, the region that does not overlap the first connecting region 41c but overlaps the first magnetic member 51 corresponds to the fourth partial region p4. In the second direction D2, the region that does not overlap the second connecting region 42c but overlaps the second magnetic member 52 corresponds to the fifth partial region p5.

The first conductive member 21 extends in the first direction D1. A length L21 along the first direction D1 of the first conductive member 21 is longer than a length W21 (width) along the third direction D3 of the first conductive member 21. In one example, the length L21 is not less than 1 μm and not more than 50 mm. In one example, the length W21 is not less than 100 nm and not more than 10.

A direction from the first conductive member 21 to the first magnetic element 11 is along the second direction D2. For example, a part of the first magnetic element 11 is located between the first conductive member 21 and the first magnetic member 51 in the second direction D2. For example, another part of the first magnetic element 11 is located between the first conductive member 21 and the second magnetic member 52 in the second direction D2.

For example, a magnetic field existing around the first element 10A (for example, the detection target magnetic field Ht (see FIG. 1A)) is collected by the first magnetic member 51 and the second magnetic member 52. The collected magnetic field passes between the first magnetic member 51 and the second magnetic member 52. The collected magnetic field passes through the first magnetic element 11. The orientation of magnetization of the magnetic layer provided in the first magnetic element 11 changes according to the magnetic field. In this example, the orientation of the magnetization 11bM of the first opposed magnetic layer 11b changes. On the other hand, the orientation of the magnetization 11aM of the first magnetic layer 11a is substantially fixed. Depending on the magnetic field, an angle between these magnetization orientations changes. The electrical resistance of the first magnetic element 11 changes according to the change in the angle. The change in electrical resistance is due to, for example, MR (magnetoresistance effect) effect. By detecting the change in electrical resistance, the detection target magnetic field Ht can be detected.

The first magnetic member 51 and the second magnetic member 52 function as, for example, an MFC (Magnetic Flux Concentrator).

The magnetic field collected by the first magnetic member 51 and the second magnetic member 52 passes through the first partial region p1 of the first magnetic element 11. The magnetic field does not substantially pass through the fourth partial region p4 and the fifth partial region p5. The electrical resistance of the first partial region p1 changes according to the magnetic field. On the other hand, the electrical resistances of the fourth partial region p4 and the fifth partial region p5 do not change substantially. In the embodiment, the first connecting region 41c of the first wiring 41 is connected to the second partial region p2 near the first partial region p1. The second connecting region 42c of the second wiring 42 is connected to the third partial region p3 near the first partial region p1. As a result, the electrical resistance of the first partial region p1 in which the electrical resistance changes is efficiently detected.

For example, a reference example in which the first wiring 41 is connected to the fourth partial region p4 and the second wiring 42 is connected to the fifth partial region p5 can be considered. In this reference example, the detected electrical resistance includes the electrical resistance of the fourth partial region p4 and the fifth partial region p5 in which the electrical resistance does not change. Therefore, the change in electrical resistance is small.

On the other hand, in the embodiment, the electrical resistance of the first partial region p1 in which the electrical resistance changes is efficiently detected. The change in electrical resistance detected in the embodiment is larger than the change in electrical resistance detected in the reference example. In embodiments, higher sensitivity is obtained. According to the embodiment, it is possible to provide a sensor whose sensitivity can be improved.

In the embodiment, the total length (length L11) of the first magnetic element 11 can be increased by providing the fourth partial region p4 and the fifth partial region p5 in which the electrical resistance does not change. As a result, the magnetization of the magnetic layer included in the first magnetic element 11 can be stabilized. For example, generation of unintended magnetic domains can be suppressed. As a result, for example, stable electrical resistance can be obtained. For example, noise is suppressed. The electrical resistance of the first magnetic element 11 can be detected with a small current. For example, power consumption can be suppressed.

As shown in FIG. 2A, a length of the first connecting region 41c along the first direction D1 is defined as a length L41c. A length of the second connecting region 42c along the first direction D1 is defined as a length L42c. These lengths should not be too long. The length L41c is preferably, for example, not less than 1/10000 times and not more than 1/10 times the length L11. The length L42c is preferably not less than 1/10000 times and not more than 1/10 times the length L11. When the length L41c and the length L42c are 100 μm or less, the electrical resistance in the region where the electrical resistance changes can be efficiently detected. This makes it easier to obtain high sensitivity. When the length L41c and the length L42c are 10 nm or more, stable electrical connection can be easily obtained.

As shown in FIG. 1B, in the embodiment, at least a part of the first wiring 41 may overlap the first magnetic member 51 in the second direction D2. At least a part of the second wiring 42 may overlap the second magnetic member 52 in the second direction D2. For example, the first connecting region 41c may overlap the first magnetic member 51 in the second direction D2. The second connecting region 42c may overlap the second magnetic member 52 in the second direction D2.

A part of the first connecting region 41c may overlap the first insulating region 81a in the second direction D2. A part of the second connecting region 42c may overlap the first insulating region 81a in the second direction D2.

For example, as shown in FIGS. 2A and 2C, a length W51 (width) of the first magnetic member 51 along the third direction D3 is longer than the length W11 and is longer than the length W21. A length W52 (width) of the second magnetic member 52 along the third direction D3 is longer than the length W11. Since the width of the magnetic member is wide, the detection target magnetic field Ht can be efficiently collected. As will be described later, the width of the magnetic member may change along the first direction D1.

As shown in FIG. 2A, a length (thickness) of the first magnetic member 51 along the second direction D2 is defined as a length L51. The length L51 is, for example, not less than 0.1 μm and not more than 10 mm. A length (thickness) of the second magnetic member 52 along the second direction D2 is defined as a length L52. The length L52 is, for example, not less than 0.1 μm and not more than 10 mm. The length L52 may be substantially the same as the length L51.

As shown in FIG. 2B, a length (thickness) of the first magnetic element 11 along the second direction D2 is defined as a length t11. The length t11 is, for example, not less than 5 nm and not more than 100 nm. A length (thickness) of the first conductive member 21 along the second direction D2 is defined as a length t21. The length t21 is, for example, not less than 10 nm and not more than 100 μm.

A length (thickness) of the first magnetic member 51 along the second direction D2 is defined as a length t51. The length t51 is, for example, not less than 100 nm and not more than 100 μm. A length (thickness) of the second magnetic member 52 along the second direction D2 is defined as a length t52. The length t52 is, for example, not less than 100 nm and not more than 100 μm. The length t52 may be substantially the same as the length t51.

As shown in FIGS. 1C and 1D, the insulating member 81 may include a second insulating region 81b. The second insulating region 81b is located between the first conductive member 21 and the first magnetic element 11. The insulating member 81 may include a third insulating region 81c. The third insulating region 81c is located between the first connecting region 41c and the first magnetic member 51. The insulating member 81 may include a fourth insulating region 81d. The fourth insulating region 81d is located between the second connecting region 42c and the second magnetic member 52.

As shown in FIG. 1A, the sensor 110 may include a controller 70. The controller 70 may be provided separately from the sensor 110. The controller 70 includes a first circuit 71. As shown in FIG. 1A, the first conductive member 21 includes a first conductive portion 21e and a first other conductive portion 21f. A direction from the first other conductive portion 21f to the first conductive portion 21e is along the first direction D1. The first circuit 71 is electrically connected to the first conductive portion 21e and the first other conductive portion 21f. The first circuit 71 is configured to supply a first current i1 including an AC component to the first conductive member 21. For example, the first current i1 may include an alternating current component and a direct current component. A first magnetic field Ha (see FIG. 1A) is generated by the first current i1. The first magnetic field Ha includes an AC magnetic field component. For example, the first magnetic field Ha may include an AC component and a DC component. The AC magnetic field component of the first magnetic field Ha changes according to the change of the AC component of the first current i1.

The first magnetic field Ha generated by the first current i1 is applied to the first magnetic element 11. An electrical resistance of the first magnetic element 11 changes by the change of the AC magnetic field component according to the change of the AC component of the first current i1. The electrical resistance of the first magnetic element 11 changes according to the change of the first current i1.

The first magnetic field Ha based on the first current i1 and the detection target magnetic field Ht are applied to the first magnetic element 11. By processing the electrical resistance of the first magnetic element 11 based on the frequency of the AC magnetic field component of the first magnetic field Ha, noise can be suppressed and the detection target magnetic field Ht can be detected with high sensitivity. An example of the first current i1 will be described later.

In the embodiment, an AC magnetic field (the first magnetic field Ha) including a component in the third direction D3 is applied to the first magnetic element 11. By processing a signal including a change in electrical resistance based on the frequency of the AC component of the AC magnetic field (first magnetic field Ha), the detection target magnetic field Ht can be detected with high sensitivity. The first conductive member 21 generates the AC magnetic field (first magnetic field Ha) including a component in the third direction D3. The first conductive member 21 is a magnetic field generating portion 28 that generates the AC magnetic field.

As shown in FIG. 1A, the controller 70 may include a second circuit 72 and a third circuit 73. The second circuit 72 is configured to supply a detection current id to the first magnetic element 11. The detection current id is, for example, a current for detecting electrical resistance. The detection current id may be, for example, a direct current.

The third circuit 73 is configured to detect a signal corresponding to a change in the electrical resistance of the first magnetic element 11. For example, the third circuit 73 is configured to detect a value corresponding to the electrical resistance between the first wiring 41 and the second wiring 42. The detection target magnetic field can be detected with high sensitivity based on the detected value corresponding to the electrical resistance.

In the sensor 110, the shapes of the first magnetic member 51 and the second magnetic member 52 are substantially rectangular. Such a configuration is referred to as a first structure. In the embodiment, these magnetic members can be variously deformed. Hereinafter, some examples relating to MFC such as the first magnetic member 51 and the second magnetic member 52 will be described. In the following description, the portion excluding the magnetic member may be the same as the configuration of the sensor 110.

Figure 3:
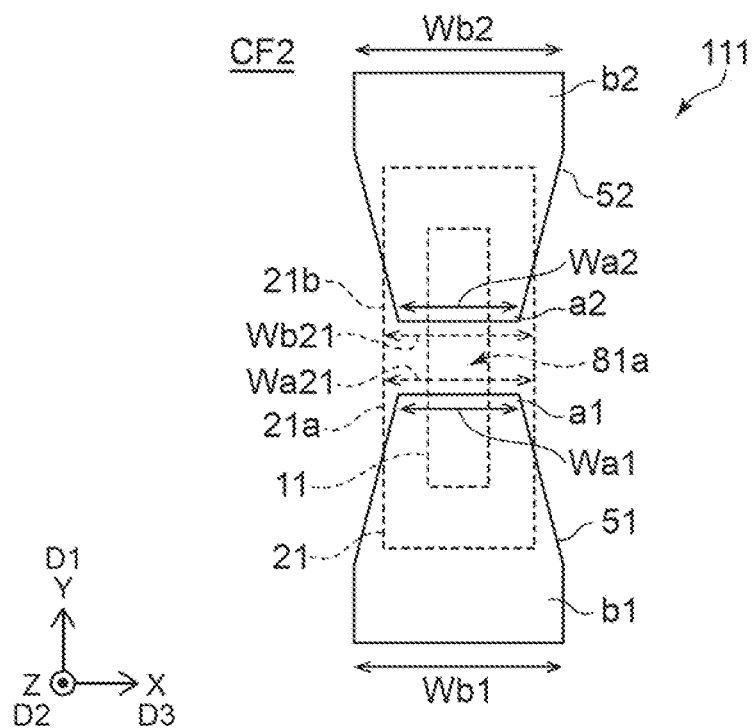
FIG. 3 is a schematic plan view illustrating the sensor according to the first embodiment.

FIG. 3 is a schematic plan view illustrating the sensor according to the first embodiment.

As shown in FIG. 3, in a sensor 111 according to the embodiment, the magnetic member has the second structure CF2. In the second structure CF2, the widths of the first magnetic member 51 and the second magnetic member 52 change along the first direction D1.

The first magnetic member 51 includes a first portion a1 and a first other portion b1. The first portion a1 is located between the first insulating region 81a and the first other portion b1 in the first direction D1. A width Wa1 of the first portion a1 along the third direction D3 is narrower than a width Wb1 of the first other portion b1 along the third direction D3.

The second magnetic member 52 includes a second portion a2 and a second other portion b2. The second portion a2 located is between the first insulating region 81a and the second other portion b2 in the first direction D1. A width Wa2 of the second portion a2 along the third direction D3 is narrower than a width Wb2 of the second other portion b2 along the third direction D3.

In the second structure CF2, the width of the portion of the first magnetic member 51 on the side of the second magnetic member 52 is narrow. The width of the portion of the second magnetic member 52 on the side of the first magnetic member 51 is narrow. These magnetic members are tapered. As a result, the detection target magnetic field Ht is more concentrated. The detection target magnetic field Ht is more efficiently applied to the first partial region p1 of the first magnetic element 11. Higher sensitivity detection is possible.

The first conductive member 21 includes a first conductive region 21a. The first conductive region 21a overlaps the first portion a1 in the second direction D2. A width of the first conductive region 21a along the third direction D3 is defined as a width Wa21. In the embodiment, the width Wa21 is preferably wider than the width Wa1 of the first portion a1 along the third direction D3 and narrower than the width Wb1 of the first other portion b1 along the third direction D3. The detection target magnetic field Ht can be more efficiently concentrated on the first magnetic element 11.

The first conductive member 21 includes a second conductive region 21b. The second conductive region 21b overlaps the second portion a2 in the second direction D2. A width of the second conductive region 21b along the third direction D3 is defined as a width Wb21. In the embodiment, the width Wb21 is preferably wider than the width Wa2 of the second portion a2 along the third direction D3 and narrower than the width Wb2 of the second other portion b2 along the third direction D3. The detection target magnetic field Ht can be more efficiently concentrated on the first magnetic element 11.

Figure 4:
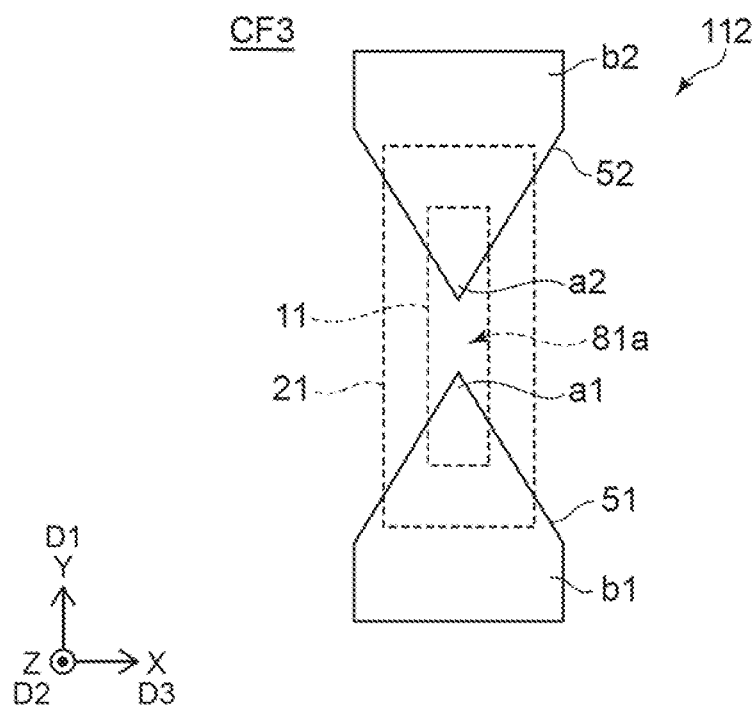
FIG. 4 is a schematic plan view illustrating the sensor according to the first embodiment.

FIG. 4 is a schematic plan view illustrating the sensor according to the first embodiment.

As shown in FIG. 4, in a sensor 112 according to the embodiment, the magnetic member has a third structure CF3. In the third structure CF3, the first portion a1 is angular. The second portion a2 is angular.

Figure 5A:
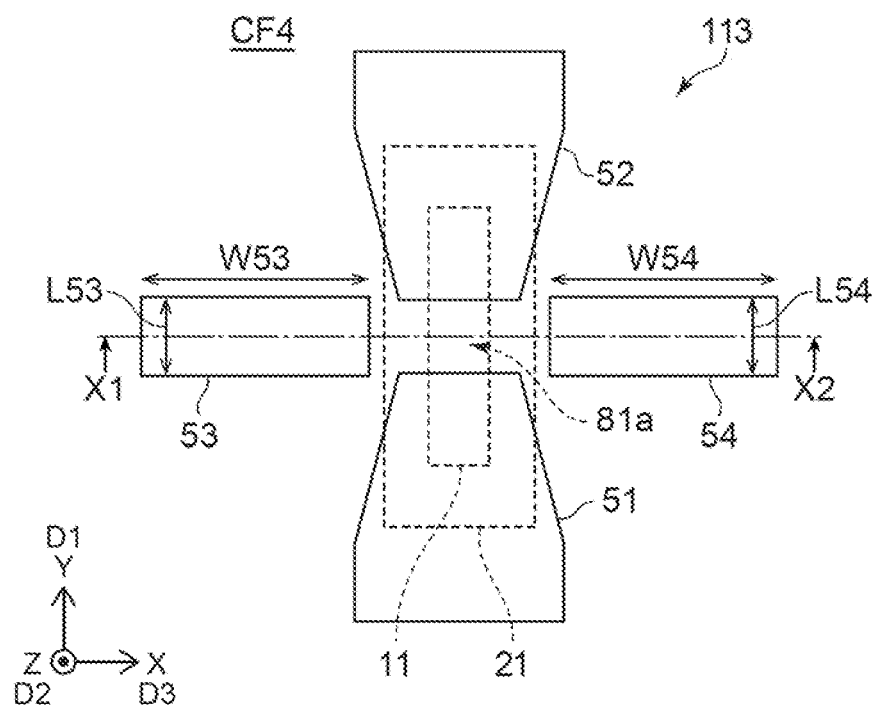
FIGS. 5A and 5B are schematic views illustrating the sensor according to the first embodiment.
Figure 5B:
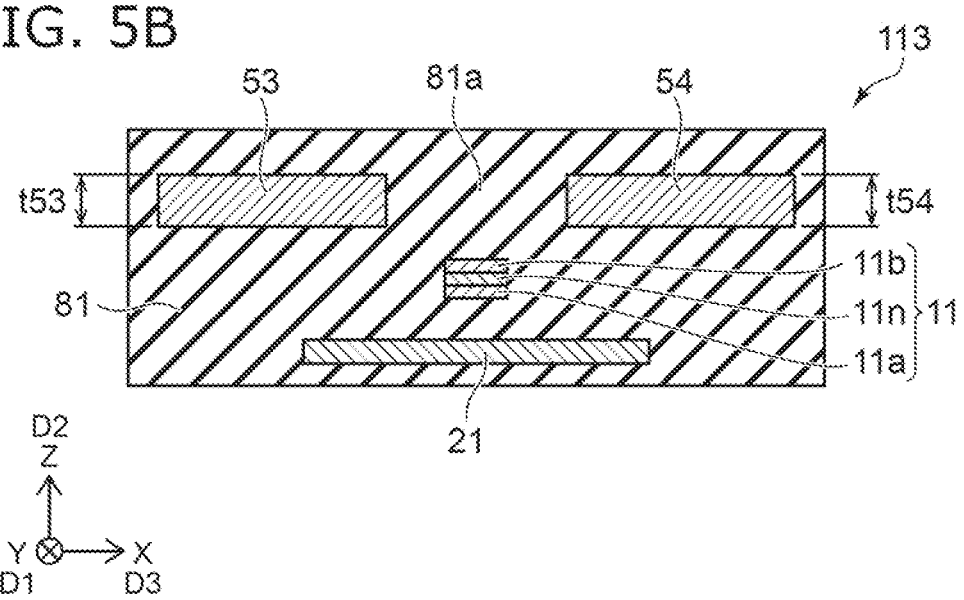

FIGS. 5A and 5B are schematic views illustrating the sensor according to the first embodiment.

FIG. 5A is a plan view. FIG. 5B is a cross-sectional view taken along the line X1-X2 of FIG. 5A. As shown in FIG. 5, in a sensor 113 according to the embodiment, the magnetic member has the fourth structure CF4. In the fourth structure CF4, a third magnetic member 53 and a fourth magnetic member 54 are provided. Except for this, the configuration of the fourth structure CF4 may be the same as the configuration of the second structure CF2.

The fourth magnetic member 54 is separated from the third magnetic member 53 in the third direction D3. The first insulating region 81a is provided between the third magnetic member 53 and the fourth magnetic member 54. By providing the third magnetic member 53 and the fourth magnetic member 54, it is possible to collect the magnetic field including the component in the third direction D3. For example, the first magnetic field Ha generated by the flow of the first current i1 through the first conductive member 21 can be efficiently collected. The change in the electrical resistance of the first magnetic element 11 corresponding to the change in the first current i1 can be increased.

A length (width) of the third magnetic member 53 along the first direction D1 is defined as a length L53 (see FIG. 5A). The length L53 is, for example, not less than 1 μm and not more than 100 μm. A length (width) of the fourth magnetic member 54 along the first direction D1 is defined as a length L54 (see FIG. 5A). The length L54 is, for example, not less than 1 μm and not more than 100 μm.

A length of the third magnetic member 53 along the third direction D3 is defined as a length W53 (see FIG. 5A). The length W53 is, for example, not less than 10 μm and not more than 10 mm. A length (width) of the fourth magnetic member 54 along the third direction D3 is defined as a length W54 (see FIG. 5A). The length W54 is, for example, not less than 10 μm and not more than 10 mm.

A length (thickness) of the third magnetic member 53 along the second direction D2 is defined as a length t53 (see FIG. 5B). The length t53 is, for example, not less than 100 nm and not more than 100 μm. A length (thickness) of the fourth magnetic member 54 along the second direction D2 is defined as a length t54 (see FIG. 5C). The length t54 is, for example, not less than 100 nm and not more than 100 μm. The length t54 may be substantially the same as the length t53. The length t53 and the length t54 may be substantially the same as the length t51 and the length t52.

Figure 6:
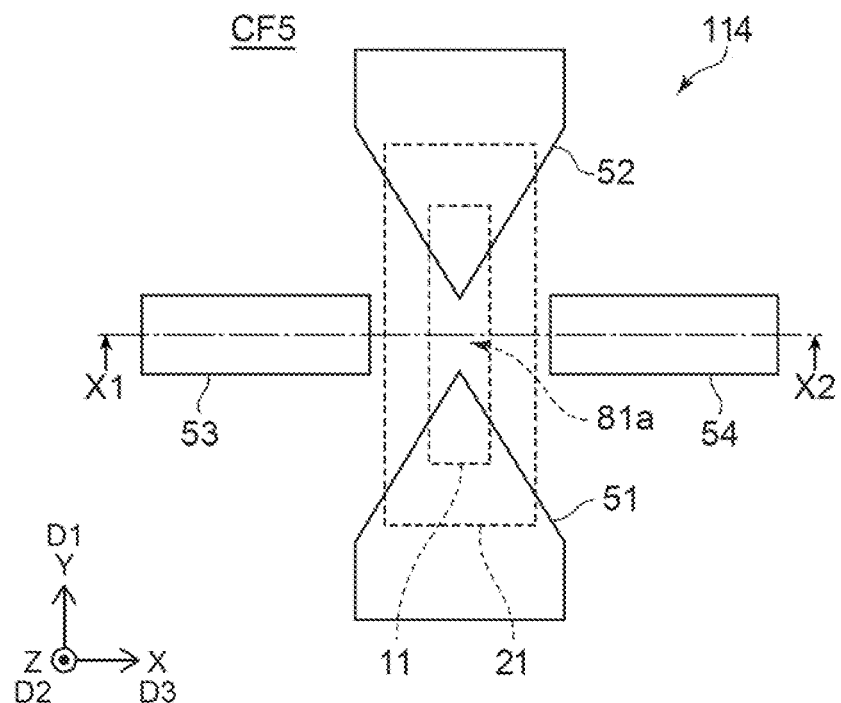
FIG. 6 is a schematic plan view illustrating the sensor according to the first embodiment.

FIG. 6 is a schematic plan view illustrating the sensor according to the first embodiment.

As shown in FIG. 6, in a sensor 114 according to the embodiment, the magnetic member has a fifth structure CF5. In the fifth structure CF5, the first magnetic member 51 and the second magnetic member 52 have the configurations in the third structure CF3. In the fifth structure CF5, the third magnetic member 53 and the fourth magnetic member 54 described with respect to the fourth structure CF4 are provided.

Figure 7:
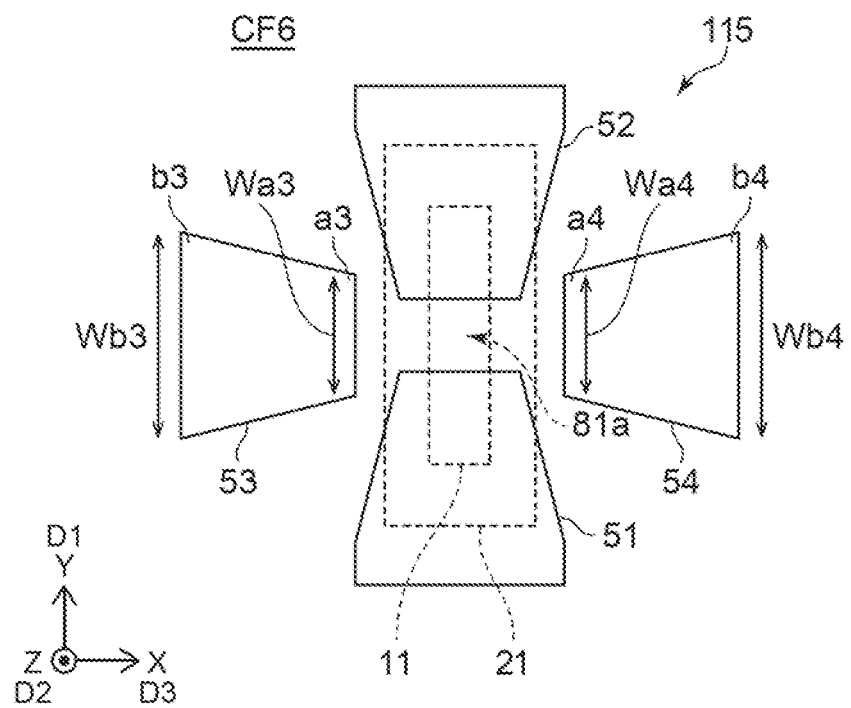
FIG. 7 is a schematic plan view illustrating the sensor according to the first embodiment.

FIG. 7 is a schematic plan view illustrating the sensor according to the first embodiment.

As shown in FIG. 7, in a sensor 115 according to the embodiment, the magnetic member has a sixth structure CF6. In the sixth structure CF6, the first to fourth magnetic members 51 to 54 are provided. The first magnetic member 51 and the second magnetic member 52 are tapered. In the sixth structure CF6, the third magnetic member 53 and the fourth magnetic member 54 are also tapered. Except for this, the configuration of the sixth structure CF6 may be the same as that of the fourth structure CF4, for example.

In the sixth structure CF6, the third magnetic member 53 includes a third portion a3 and a third other portion b3. The third portion a3 is located between the first insulating region 81a and the third other portion b3 in the third direction D3. A width Wa3 of the third portion a3 along the first direction D1 is narrower than a width Wb3 along of the third other portion b3 the first direction D1.

In the sixth structure CF6, the fourth magnetic member 54 includes a fourth portion a4 and a fourth other portion b4. The fourth portion a4 is located between the first insulating region 81a and the fourth other portion b4 in the third direction D3. A width Wa4 of the fourth portion a4 along the first direction D1 is narrower than a width Wb4 of the fourth other portion b4 along the first direction D1.

Since the width Wa3 is narrower than the width Wb3 and the width Wa4 is narrower than the width Wb4, the first magnetic field Ha including the component in the third direction D3 can be more effectively concentrated in the first partial region p1 of the first magnetic element 11. For example, the first magnetic field Ha generated by the flow of the first current i1 through the first conductive member 21 can be collected more efficiently. The change in the electrical resistance of the first magnetic element 11 corresponding to the change in the first current i1 can be made larger.

Figure 8:
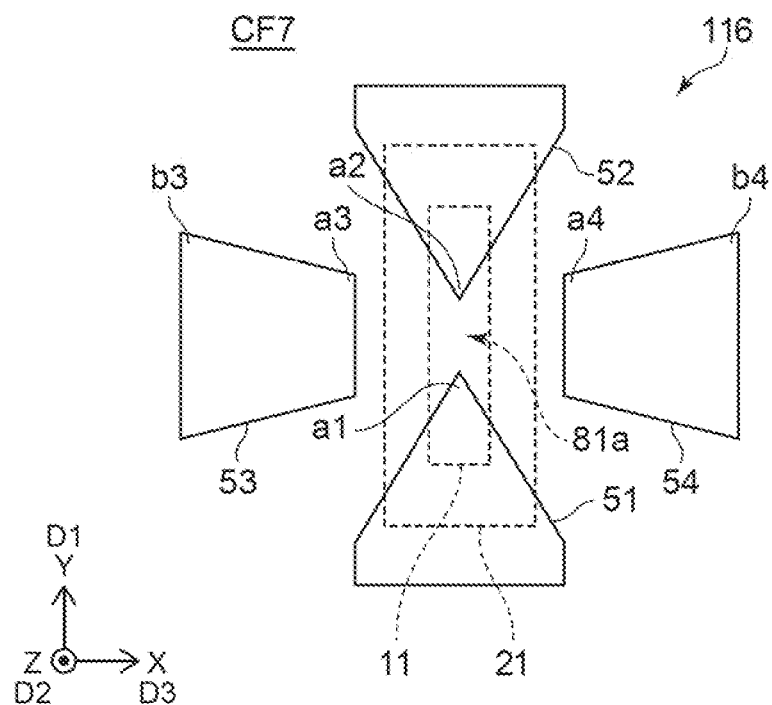
FIG. 8 is a schematic plan view illustrating the sensor according to the first embodiment.

FIG. 8 is a schematic plan view illustrating the sensor according to the first embodiment.

As shown in FIG. 8, in a sensor 116 according to the embodiment, the magnetic member has a seventh structure CF7. In the seventh structure CF7, the first portion a1 of the first magnetic member 51 and the second portion a2 of the second magnetic member 52 are angular. In the seventh structure CF7, the third magnetic member 53 and the fourth magnetic member 54 described with respect to the sixth structure CF6 are provided.

Below, simulation results of the characteristics of the various structures described above will be described. In the simulation model, the length L11 of the first magnetic element 11 is 100 μm. The length W11 (width) is 5 μm. The length t11 (thickness) is 50 nm. The length L21 of the first conductive member 21 is 400 μm. The length W21 (width) is 20 μm. The length t21 (thickness) is 500 μm. The thicknesses of the magnetic member (lengths t51 to t54) are 2 μm. The length L51 of the first magnetic member 51 is 100 μm. The length W51 (width) of the first magnetic member 51 is 20 μm. The length L52 of the second magnetic member 52 is 100 μm. The length W52 (width) of the second magnetic member 52 is 20 μm. The length L53 (width) of the third magnetic member 53 is 8 μm. The length W53 of the third magnetic member 53 is 50 μm. The length L54 (width) of the fourth magnetic member 54 is 8 μm. The length W54 of the fourth magnetic member 54 is 50 μm.

When the magnetic member is tapered, the angle between the tapered side and the first direction D1 is 45 degrees. In the second structure CF2 and the fourth structure CF4, the portion of the first magnetic member 51 and the second magnetic member 52 on the side of the first insulating region 81a is trapezoidal. In this case, the width (widths Wa1 and Wa1) of the portion on the side of the first insulating region 81a is ½ of the width (widths Wb1 and Wb2) of the other portions. The distance g1 (see FIG. 2B) between the first magnetic member 51 and the second magnetic member 52 is 10 μm.

In the simulation, the first direction magnetic field and the third-direction magnetic field are applied to the first element 10A. The first direction magnetic field is along the first direction D1. The first direction magnetic field corresponds to the detection target magnetic field Ht. On the other hand, in order to avoid the occurrence of singular points in the simulation, the angle between the third direction magnetic field and the third direction D3 is 10 degrees. The third-direction magnetic field corresponds to the first magnetic field Ha generated when the first current i1 flows through the first conductive member 21.

Figure 9:
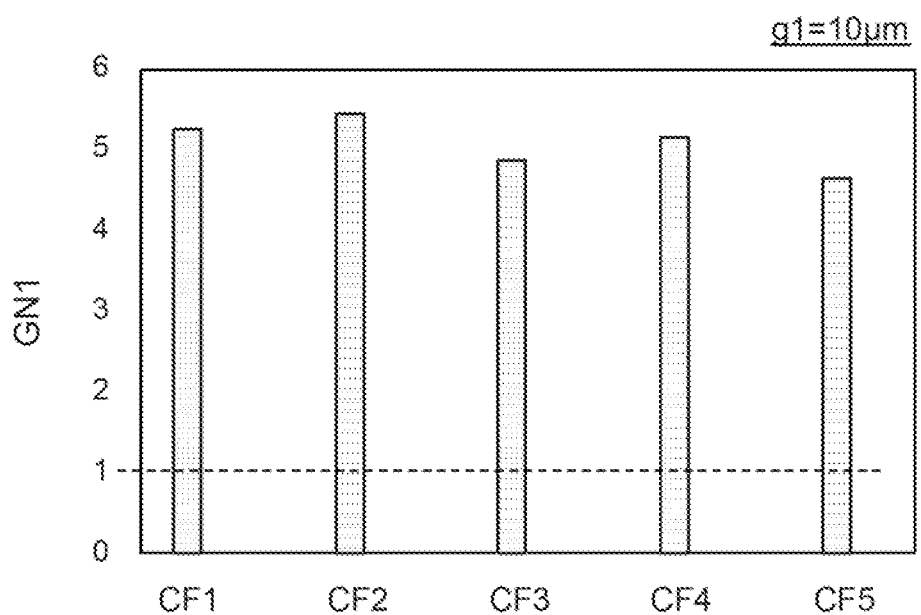
FIG. 9 is a graph illustrating the characteristics of the sensor.

FIG. 9 is a graph illustrating the characteristics of the sensor.

FIG. 9 shows the characteristics of the first to fifth structures CF1 to CF5. The vertical axis of FIG. 9 is a gain GN1. The gain GN1 relates to the magnetic flux density in the first direction D1. The gain GN1 is the ratio of the magnetic flux density to the magnetic flux density in the first partial region p1 when the magnetic member is not provided. The high gain GN1 corresponds to that the first direction magnetic field (detection target magnetic field Ht) can be efficiently concentrated on the first partial region p1.

As shown in FIG. 9, in the first to fifth structures CF1 to CF5, a gain GN1 higher than 1 can be obtained. The gain GN1 of the second structure CF2 is higher than the gain GN1 of the first structure CF1. A high gain GN1 can be obtained by thinning the tip of the magnetic member into a trapezoidal shape. The tip portion of the magnetic member is a region including each of the first portion a1, the second portion a2, the third portion a3, and the fourth portion a4.

The gain GN1 of the third structure CF3 is lower than the gain GN1 of the second structure CF2. The gain GN1 of the fifth structure CF5 is lower than the gain GN1 of the fourth structure CF4. It is considered that the gain GN1 becomes low when the tip portion of the magnetic member becomes excessively thin. It is more preferable that the tip portion of the magnetic member has a trapezoidal shape.

Figure 10:
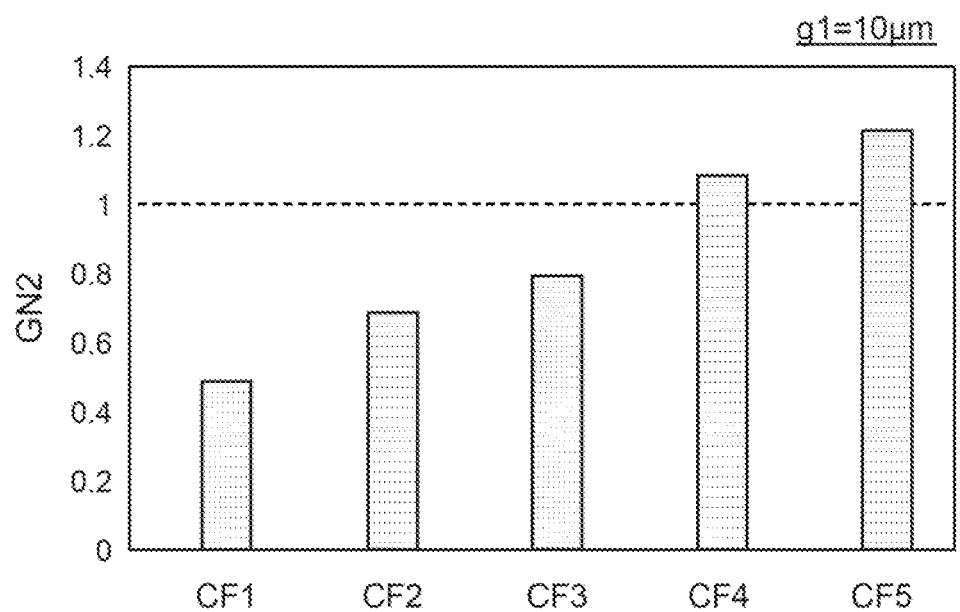
FIG. 10 is a graph illustrating the characteristics of the sensor.

FIG. 10 is a graph illustrating the characteristics of the sensor.

FIG. 10 shows the characteristics of the first to fifth structures CF1 to CF5. The vertical axis of FIG. 10 is the gain GN2. The gain GN2 relates to the magnetic flux density in the third direction D3. The gain GN2 is the ratio of the magnetic flux density to the magnetic flux density in the first partial region p1 when the magnetic member along the third direction D3 is not provided. The high gain GN2 corresponds to that the third-direction magnetic field (AC magnetic field based on the first current i1 (first magnetic field Ha)) can be efficiently concentrated on the first partial region p1.

As shown in FIG. 10, in the first to third structures CF1 to CF3, the gain GN2 is lower than 1. In the fourth structure CF4 and the fifth structure CF5, the gain GN2 is higher than 1. Thus, by providing the third magnetic member 53 and the fourth magnetic member 54, the AC magnetic field (first magnetic field Ha) based on the first current i1 can be efficiently collected in the first partial region p1.

As described with respect to FIG. 9, the gain GN1 is also higher than 1 in the first to third structures CF1 to CF3. The detection target magnetic field Ht can be detected with higher sensitivity than when the magnetic member is not provided.

Figure 11A:
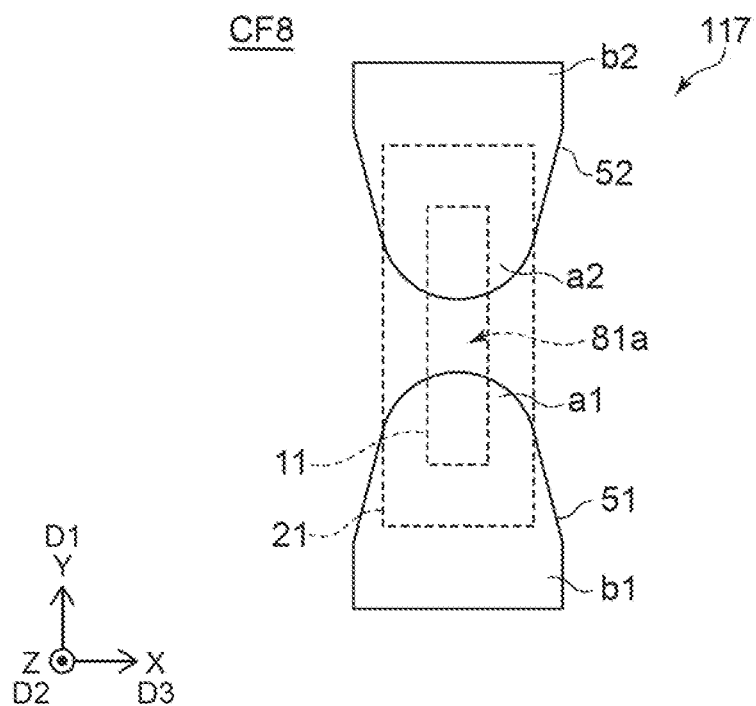
FIGS. 11A and 11B are schematic plan views illustrating the sensor according to the first embodiment.
Figure 11B:
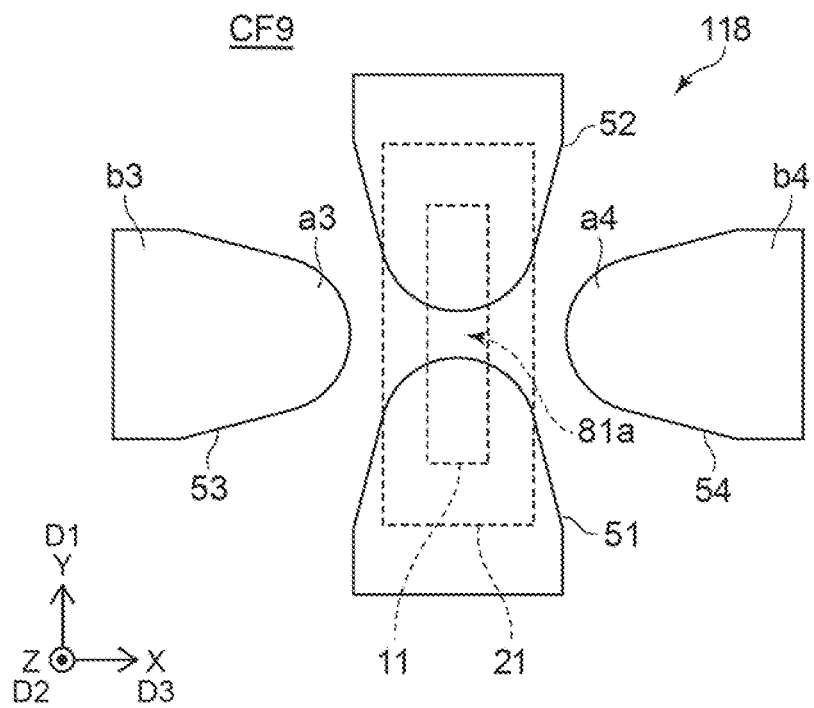

FIGS. 11A and 11B are schematic plan views illustrating the sensor according to the first embodiment.

As shown in FIG. 11A, in a sensor 117 according to the embodiment, the magnetic member has an eighth structure CF8. In the eighth structure CF8, the tip portion of the first magnetic member 51 and the tip portion of the second magnetic member 52 are curved (arc-shaped).

As shown in FIG. 11B, in a sensor 118 according to the embodiment, the magnetic member has a ninth structure CF9. In the ninth structure CF9, the tip portion of the third magnetic member 53 and the tip portion of the fourth magnetic member 54 are curved (arc-shaped). The tip of the magnetic member may be trapezoidal or arcuate.

Figure 12A:
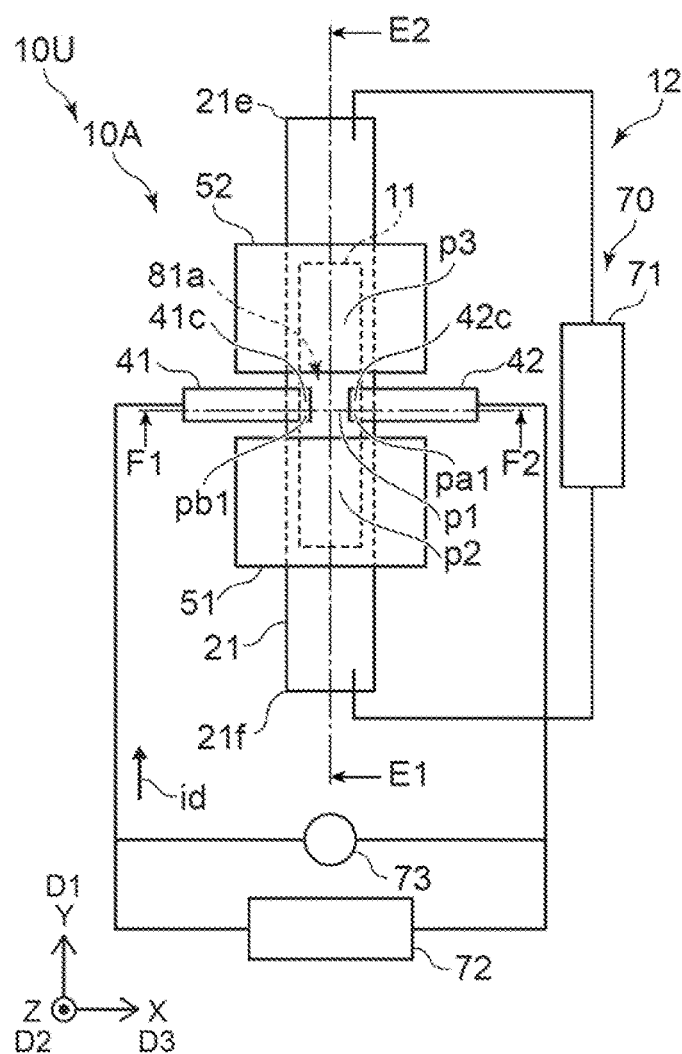
FIGS. 12A to 12C are schematic views illustrating the sensor according to the first embodiment.
Figure 12B:
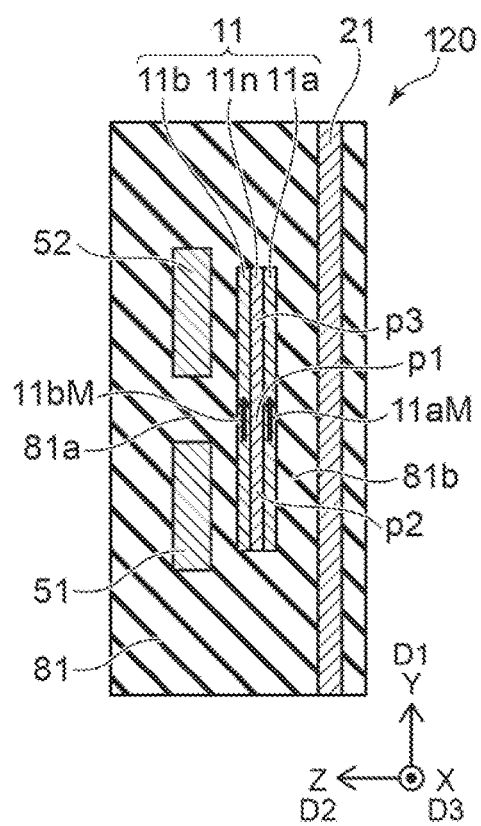
Figure 12C:
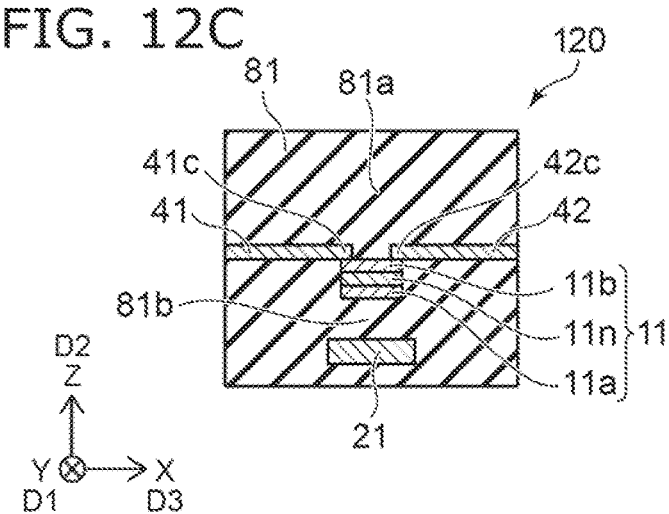

FIGS. 12A to 12C are schematic views illustrating the sensor according to the first embodiment.

FIG. 12A is a plan view. FIG. 12B is a sectional view taken along line E1-E2 of FIG. 12a. 12C is a sectional view taken along line F1-F2 of FIG. 12A.

As shown in FIGS. 12A to 12C, a sensor 120 according to the embodiment includes the first element 10A. The first element 10A includes the first magnetic member 51, the second magnetic member 52, the insulating member 81, the first wiring 41, the second wiring 42, the first magnetic element 11, and the first conductive member 21.

The second magnetic member 52 is separated from the first magnetic member 51 in the first direction D1 from the first magnetic member 51 to the second magnetic member 52. The insulating member 81 includes the first insulating region 81a. The first insulating region 81a is provided between the first magnetic member 51 and the second magnetic member 52.

The first wiring 41 includes the first connecting region 41c. The second wiring 42 includes a second connecting region 42c.

The first magnetic element 11 includes the first magnetic layer 11a and the first opposed magnetic layer 11b. The second direction D2 from the first magnetic layer 11a to the first opposed magnetic layer 11b crosses the first direction D1. In this example, the first magnetic element 11 includes the first non-magnetic layer 11n. The first non-magnetic layer 11n includes, for example, at least one selected from the group consisting of Cu, Au and Al.

Also in this example, the length of the first magnetic element 11 along the first direction D1 (length L11, see FIG. 2C) is longer than the length of the first magnetic element along the third direction D3 (length W11, see FIG. 2C). The third direction D3 crosses a plane including the first direction D1 and the second direction D2.

As shown in FIG. 12B, the first magnetic element 11 includes the first partial region p1. The direction from the first partial region p1 to the first insulating region 81a is along the second direction D2.

As shown in FIG. 12A, the first connecting region 41c is electrically connected to a part of the first partial region p1. The second connecting region 42c is electrically connected to another part of the first partial region p1. The direction from the part of the first partial region p1 to the other part of the first partial region p1 includes a component of the third direction D3. For example, the direction from the part of the first partial region p1 to the other part of the first partial region p1 may be along the third direction D3. For example, the direction from the first connecting region 41c to the second connecting region 42c includes a component of the third direction D3. For example, the direction from the first connecting region 41c to the second connecting region 42c may be along the third direction D3.

The first conductive member 21 extends in the first direction D1. The direction from the first conductive member 21 to the first magnetic element 11 is along the second direction D2.

In such a sensor 120, the detection target magnetic field Ht along the first direction D1 can be efficiently concentrated in the first partial region p1 by the first magnetic member 51 and the second magnetic member 52. It is possible to provide a sensor whose characteristics can be improved.

As shown in FIGS. 12A and 12B, the first magnetic element 11 may include the second partial region p2 and the third partial region p3. The first partial region p1 is located between the second partial region p2 and the third partial region p3 in the first direction D1. The second partial region p2 overlaps the first magnetic member 51 in the second direction D2. The third partial region p3 overlaps the second magnetic member 52 in the second direction D2.

Also in the sensor 120, the length (length L11) of the first magnetic element 11 can be increased by providing the second partial region p2 and the third partial region p3. High shape anisotropy can be obtained in the first magnetic element 11. The magnetization of the magnetic layer included in the first magnetic element 11 becomes more stable.

As shown in FIG. 12A to 12C, a part of the first opposed magnetic layer 11b is located between the part of the first magnetic layer 11a and the first connecting region 41c in the second direction D2. Another part of the first opposed magnetic layer 11b is located between the other part of the first magnetic layer 11a and the second connecting region 42c in the second direction D2. The above-mentioned first to ninth structures CF1 to CF9 can be applied to the sensor 120.

FIGS. 13A to 13D are schematic views illustrating the sensor according to the first embodiment.

Figure 13A:
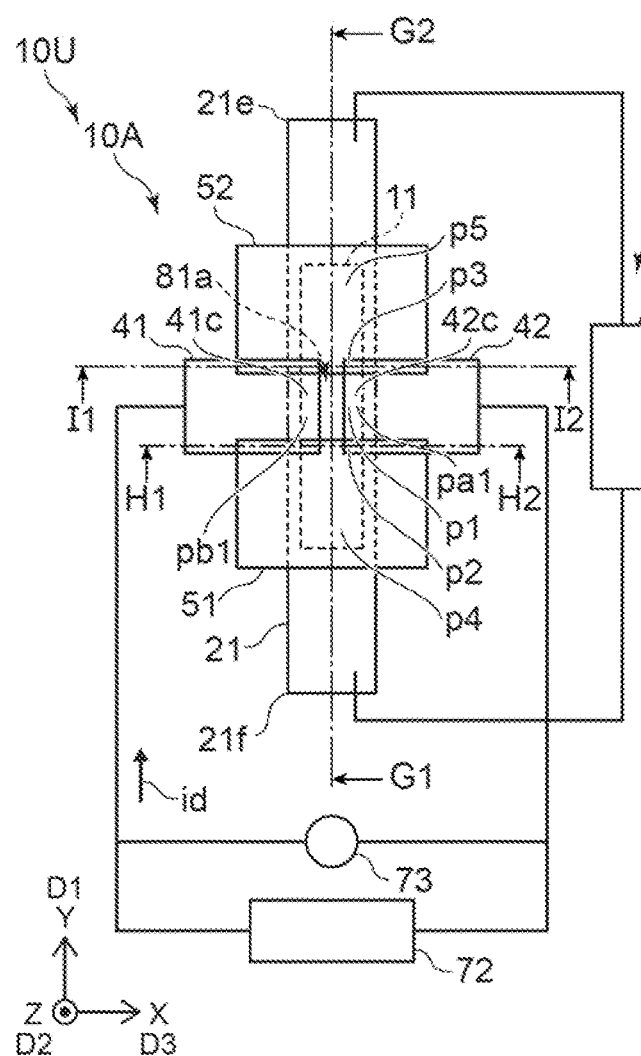
FIGS. 13A to 13D are schematic views illustrating the sensor according to the first embodiment.
Figure 13B:
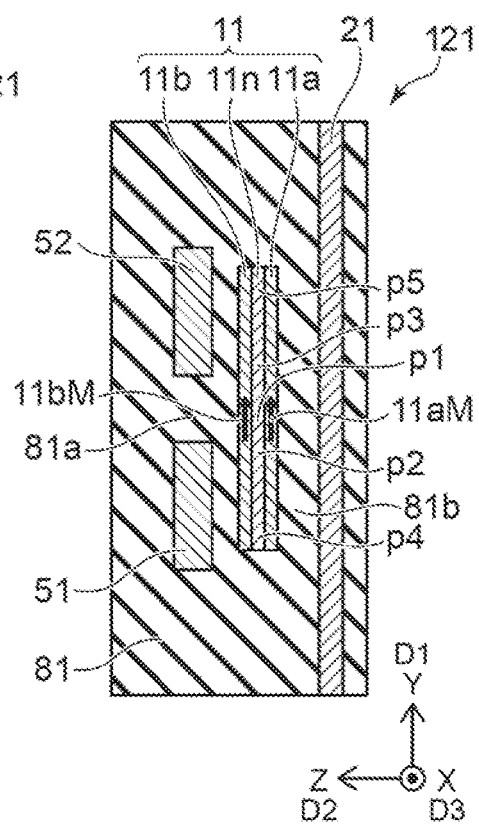
Figure 13C:
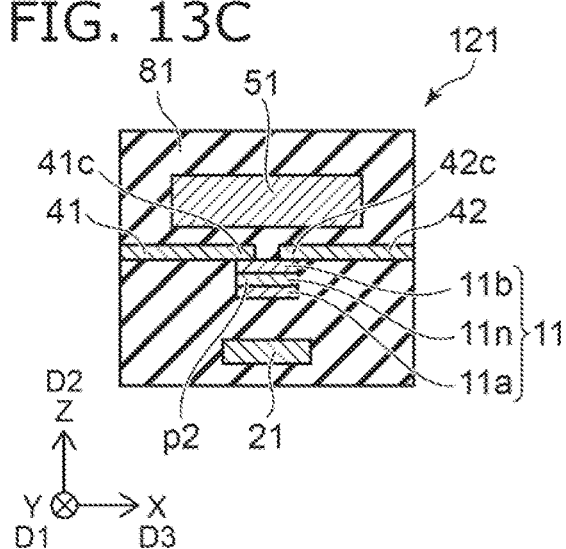
Figure 13D:
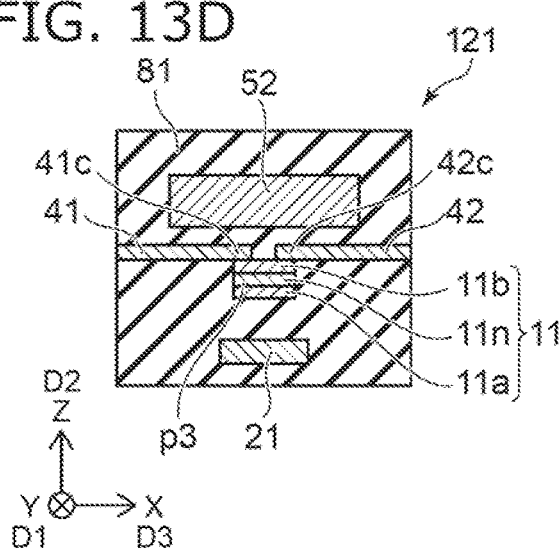

FIG. 13A is a plan view. FIG. 13B is a cross-sectional view taken along the line G1-G2 of FIG. 13A. FIG. 13C is a sectional view taken along line H1-H2 of FIG. 13A. FIG. 13D is a sectional view taken along line I1-I2 of FIG. 13A.

As shown in FIG. 13A, in a sensor 121 according to the embodiment, a part of the first wiring 41 and a part of the second wiring 42 overlap the first magnetic member 51 and the second magnetic member 52 in the second direction D2. Except for this, the configuration of the sensor 121 may be the same as the configuration of the sensor 120.

The first magnetic element 11 includes the fourth partial region p4 and the fifth partial region p5. The first partial region p1 is located between the fourth partial region p4 and the fifth partial region p5 in the first direction D1. The second partial region p2 is located between the fourth partial region p4 and the first partial region p1 in the first direction D1. The third partial region p3 is located between the first partial region p1 and the fifth partial region p5 in the first direction D1. The fourth partial region p4 does not overlap the first connecting region 41c and the second connecting region 42c in the second direction D2. The direction from the fourth partial region p4 to at least a part of the first magnetic member 51 is along the second direction D2. The fifth partial p5 does not overlap the first connecting region 41c and the second connecting region 42c in the second direction D2. The direction from the fifth partial region p5 to at least a part of the second magnetic member 52 is along the second direction D2.

By providing the fourth partial region p4 and the fifth partial region p5, the length (length L11) of the first magnetic element 11 can be increased. High shape anisotropy can be obtained in the first magnetic element 11. The magnetization of the magnetic layer included in the first magnetic element 11 becomes more stable.

FIGS. 14A to 14D are schematic views illustrating the sensor according to the first embodiment.

Figure 14A:
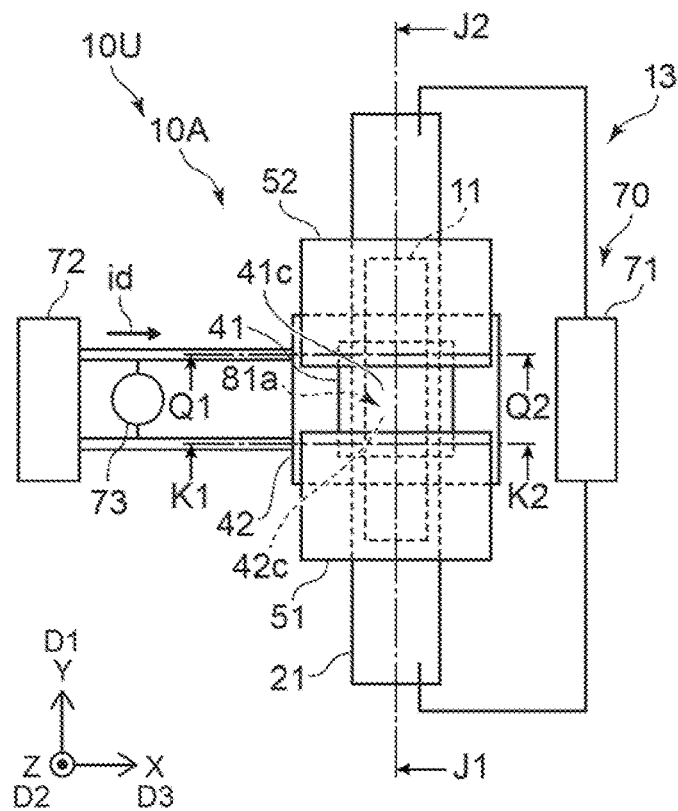
FIGS. 14A to 14D are schematic views illustrating the sensor according to the first embodiment.
Figure 14B:
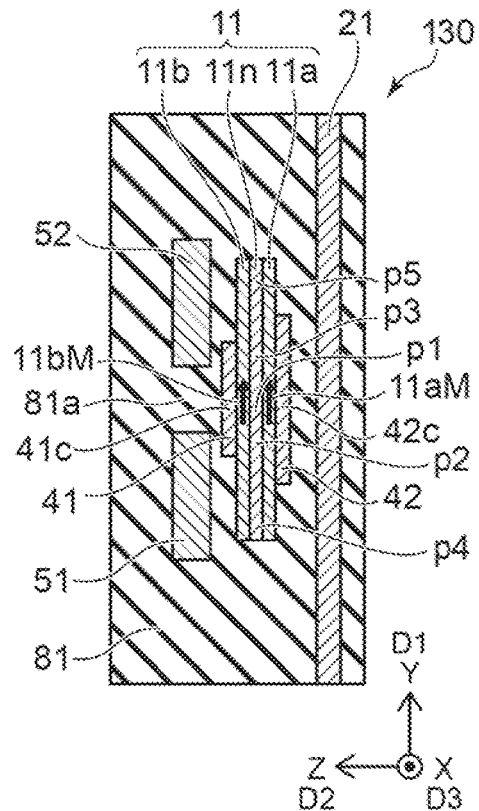
Figure 14C:
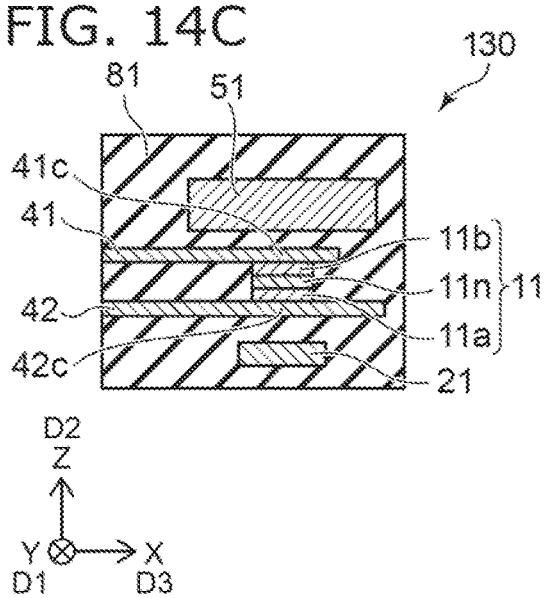
Figure 14D:
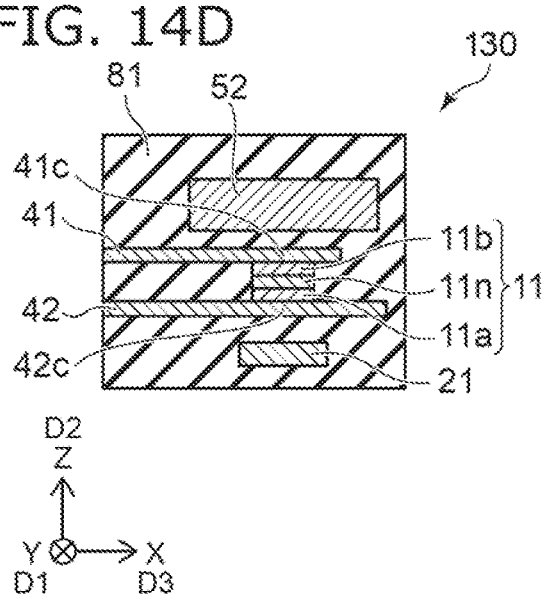

FIG. 14A is a plan view. FIG. 14B is a cross-sectional view taken along the line 31-32 of FIG. 14a. FIG. 14C is a cross-sectional view taken along the line K1-K2 of FIG. 14A. FIG. 14D is a cross-sectional view taken along the line Q1-Q2 of FIG. 14A.

As shown in FIGS. 14A to 14D, a sensor 130 according to the embodiment includes the first element 10A. The first element 10A includes the first magnetic member 51, the second magnetic member 52, the insulating member 81, the first wiring 41, the second wiring 42, the first magnetic element 11, and the first conductive member 21.

The second magnetic member 52 is separated from the first magnetic member 51 in the first direction D1 from the first magnetic member 51 to the second magnetic member 52. The insulating member 81 includes the first insulating region 81a. The first insulating region 81a is provided between the first magnetic member 51 and the second magnetic member 52. The first wiring 41 includes the first connecting region 41c. The second wiring 42 includes a second connecting region 42c.

The first magnetic element 11 includes the first magnetic layer 11a and the first opposed magnetic layer 11b. The direction from the first magnetic layer 11a to the first opposed magnetic layer 11b (second direction D2) crosses the first direction D1. In this example, the first magnetic element 11 includes the first non-magnetic layer 11n. The first non-magnetic layer 11n is provided between the first magnetic layer 11a and the first opposed magnetic layer 11b. For example, the first non-magnetic layer 11n includes oxygen and at least one selected from the group consisting of Mg, Al, Ta and Ti. The first non-magnetic layer 11n includes, for example, MgO. The first magnetic element 11 is, for example, a TMR (Tunnel Magneto Resistance) element.

The length of the first magnetic element 11 along the first direction D1 (the length L11, see FIG. 2C) is longer than the length of the first magnetic element 11 along the third direction D3 (the length W11, FIG. 2). The third direction D3 crosses a plane including the first direction D1 and the second direction D2.

The first magnetic element 11 includes the first partial region p1. As shown in FIG. 14B, the first partial region p1 is located between the second connecting region 42c and the first insulating region 81a. The first connecting region 41c is located between the first partial region p1 and the first insulating region 81a. The first connecting region 41c is electrically connected to one of the first magnetic layer 11a and the first opposed magnetic layer 11b. The second connecting region 42c is electrically connected to the other of the first magnetic layer 11a and the first opposed magnetic layer 11b.

In this example, the first connecting region 41c is electrically connected to the first magnetic layer 11a. The second connecting region 42c is electrically connected to the other of the first opposed magnetic layer 11b.

The first conductive member 21 extends in the first direction D1. The direction from the first conductive member 21 to the first magnetic element 11 is along the second direction D2.

Even in such a sensor 130, the detection target magnetic field Ht along the first direction D1 can be efficiently concentrated and applied to the first partial region p1 by the first magnetic member 51 and the second magnetic member 52. It is possible to provide a sensor whose characteristics can be improved.

As shown in FIG. 14B, in the sensor 130, the first magnetic element 11 may include the second partial region p2 and the third partial region p3. The first partial region p1 is located between the second partial region p2 and the third partial region p3 in the first direction D1. The direction from the second partial region p2 to the first magnetic member 51 is along the second direction D2. The direction from the third partial region p3 to the second magnetic member 52 is along the second direction D2.

A part of the second partial region p2 may overlap at least one of the first connecting region 41c or the second connecting region 42c in the second direction D2. A part of the third partial region p3 may overlap at least one of the first connecting region 41c or the second connecting region 42c in the second direction D2.

Also in the sensor 130, the length (the length L11) of the first magnetic element 11 can be increased by providing the second partial region p2 and the third partial region p3. High shape anisotropy can be obtained in the first magnetic element 11. The magnetization of the magnetic layer included in the first magnetic element 11 becomes more stable. By providing the second partial region p2 and the third partial region p3, a more stable detection target magnetic field Ht can be concentrated on the first partial region p1.

As shown in FIG. 14B, the first magnetic element 11 may further include the fourth partial region p4 and the fifth partial region p5. The first partial region p1 is located between the fourth partial region p4 and the fifth partial region p5 in the first direction D1. The second partial region p2 is located between the fourth partial region p4 and the first partial region p1 in the first direction D1. The third partial region p3 is located between the first partial region p1 and the fifth partial region p5 in the first direction D1. The fourth partial p4 does not overlap the first connecting region 41c and the second connecting region 42c in the second direction D2. The fifth partial p5 does not overlap the first connecting region 41c and the second connecting region 42c in the second direction D2.

By providing the fourth partial region p4 and the fifth partial region p5, the length (the length L11) of the first magnetic element 11 can be increased. High shape anisotropy can be obtained in the first magnetic element 11. The magnetization of the magnetic layer included in the first magnetic element 11 becomes more stable. The first to ninth structures CF1 to CF9 can be applied to the sensor 120, 121, and 130.

The sensors 120, 121 and the sensor 130 may be provided with the controller 70 including the first to third circuits 71 to 73.

Hereinafter, an example of operation in the sensors (sensors 110, 120, 121 and 130) according to the embodiment will be described. As described above, the first circuit 71 can supply the first current i1 including an AC component to the first conductive member 21.

Figure 15A:
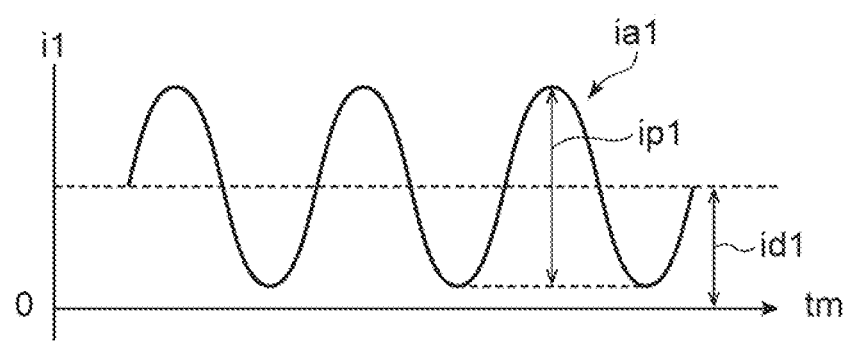
FIGS. 15A and 15B are schematic diagrams illustrating the operation of the sensor according to the first embodiment.
Figure 15B:
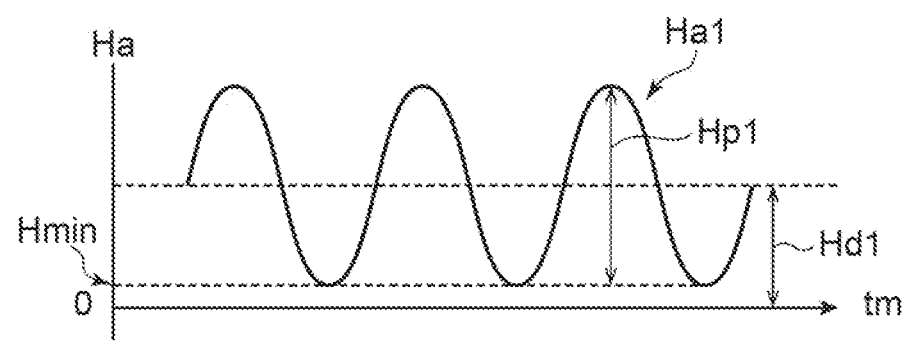

FIGS. 15A and 15B are schematic diagrams illustrating the operation of the sensor according to the first embodiment.

FIG. 15A exemplifies the first current i1. The horizontal axis of FIG. 15A is time tm. The vertical axis of FIG. 15A is the value of the first current i1. As shown in FIG. 15A, the first current i1 includes an AC component ia1. The local minimum value of the first current i1 is a first polarity, and the local maximum value of the first current i1 is the first polarity. The first polarity is one of positive and negative. Hereinafter, an example in which the first polarity is positive will be described.

For example, the first current i1 includes the AC component ia1 and a DC component id1. The DC component id1 is larger than ½ of the amplitude ip1 of the AC component ia1. In the first current i1, a difference between the local minimum value and the local maximum value corresponds to the amplitude ip1. In embodiments, both local minimum value and local maximum value are of the first polarity (e.g., positive). The first current i1 does not become the second polarity (for example, negative). The first current i1 never becomes 0.

The first magnetic field Ha is generated by the first current i1. The first magnetic field Ha is along the third direction D3. The third direction D3 is, for example, the X-axis direction.

FIG. 15B illustrates the first magnetic field Ha. The horizontal axis of FIG. 15B is time tm. The vertical axis of FIG. 15B is the intensity of the first magnetic field Ha. As shown in FIG. 15B, the first magnetic field Ha includes an AC magnetic field component Ha1. The local minimum value Hmin of the first magnetic field Ha is of the first polarity, and the local maximum value of the first magnetic field Ha is of the first polarity.

For example, the first magnetic field Ha includes the AC magnetic field component Ha1 and a DC magnetic field component Hd1. The DC magnetic field component Hd1 is larger than ½ of the amplitude Hp1 of the AC magnetic field component Ha1. In the first magnetic field Ha, the difference between the local minimum value and the local maximum value corresponds to the amplitude Hp1. In embodiments, both local minimum value and local maximum value are of the first polarity (e.g., positive). The first magnetic field Ha does not become the second polarity (for example, negative). The first magnetic field Ha never becomes zero.

In this way, the first current i1 flows through the first conductive member 21, so that the first magnetic field Ha is generated from the first conductive member 21. A first magnetic field Ha along the third direction D3 is generated from the magnetic field generating portion 28.

The first magnetic field Ha is applied to the first magnetic element 11. The first electrical resistance of the first magnetic element 11 changes according to the change of the first magnetic field Ha. The change in electrical resistance is based on, for example, the MR effect. For example, the first electrical resistance of the first magnetic element 11 changes according to the change of the first current i1.

On the other hand, the detection target magnetic field Ht is applied to the first magnetic element 11. The first electrical resistance of the first magnetic element 11 also changes depending on the detection target magnetic field Ht. As described above, the first electrical resistance changes depending on both the first current i1 (and the first magnetic field Ha) and the detection target magnetic field Ht. In the embodiment, the change in the first electrical resistance is detected, and the detected signal is processed based on the frequency of the AC component ia1 of the first current i1 (the frequency of the AC magnetic field component Ha1 of the first magnetic field Ha). By the processing, the target magnetic field Ht can be detected.

In the embodiment, as described above, both the local minimum value and the local maximum value are of the first polarity (for example, positive). For example, the first current i1 and the first magnetic field Ha are always of the first polarity (positive) and cannot be 0 or negative. This enables detection with suppressed noise.

For example, when the first current i1 (and the first magnetic field) changes from positive to 0 or negative, magnetic domain disturbance occurs in at least one of the first magnetic layer 11a or the first opposed magnetic layer 11b. Disturbances in magnetic domains include, for example, formation of magnetic domains, disappearance of magnetic domains, or movement of magnetic domains. Noise is generated in the signal obtained from the first magnetic element 11 due to the disturbance of the magnetic domain. In the embodiment, when the first current i1 and the first magnetic field Ha always have one polarity (for example, positive), noise caused by the disturbance of the magnetic domain can be suppressed. This enables more stable and highly sensitive detection. According to the embodiment, it is possible to provide a sensor and an inspection device capable of improving the characteristics.

Figure 16A:
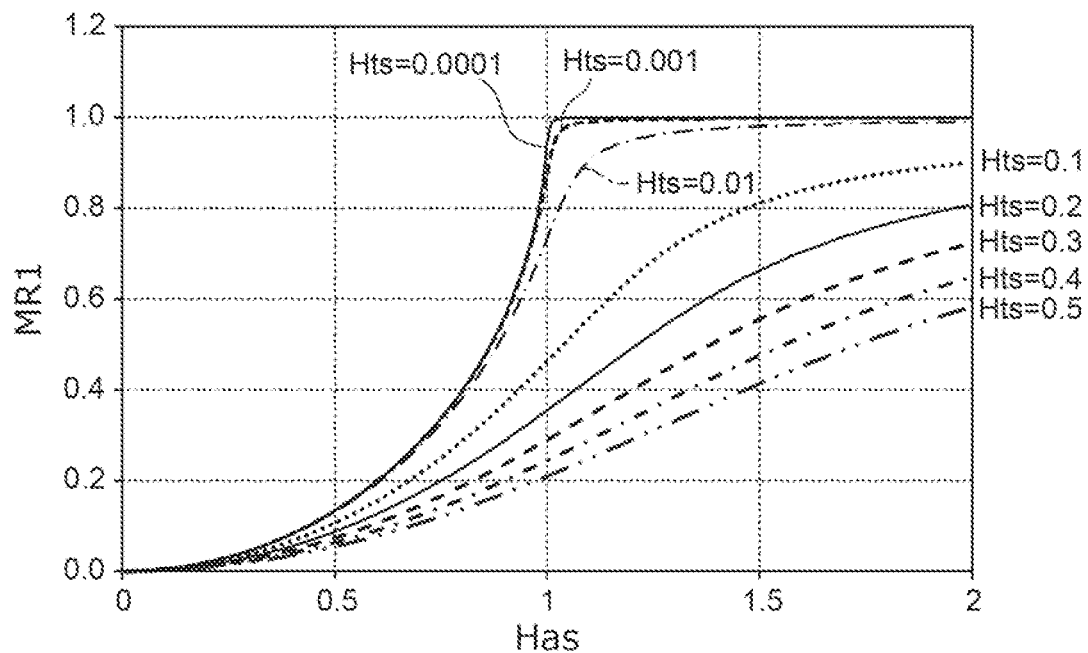
FIGS. 16A and 16B are graphs illustrating the characteristics of the sensor.
Figure 16B:
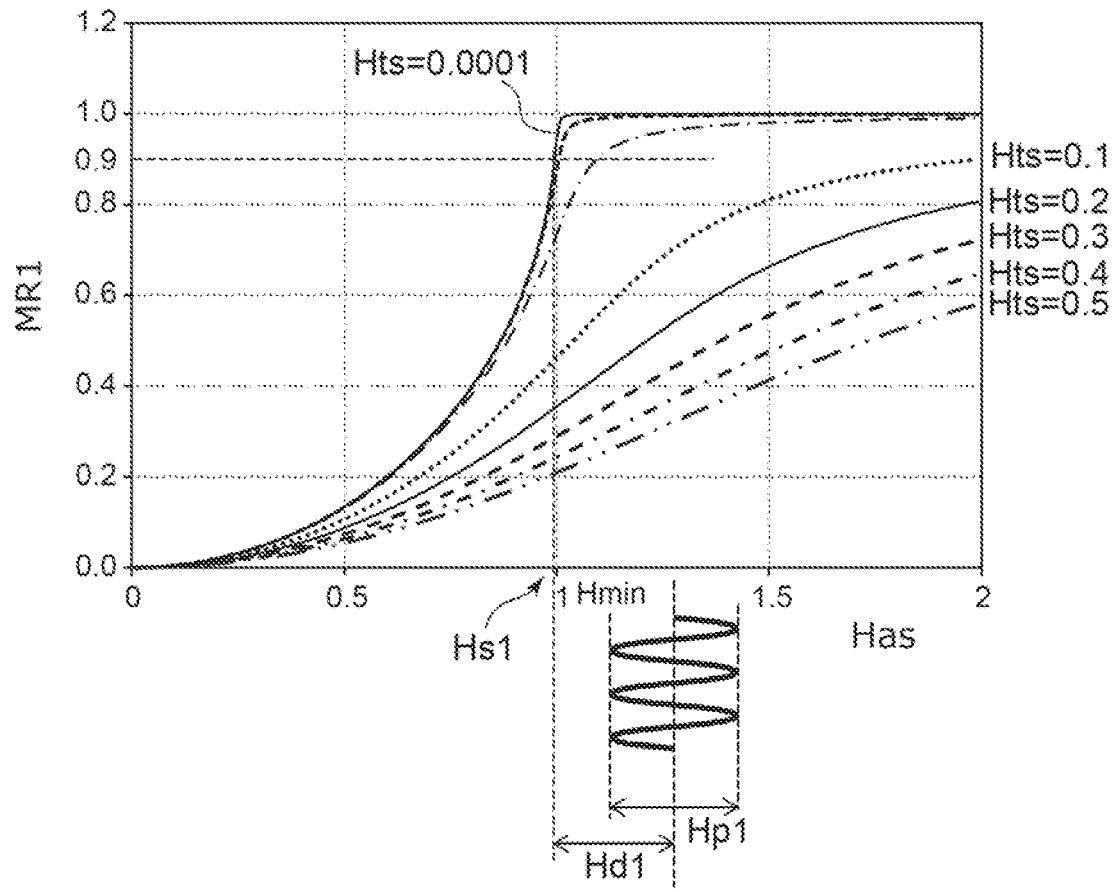

FIGS. 16A and 16B are graphs illustrating the characteristics of the sensor.

These figures exemplify the simulation results of the characteristics of the sensor 110 according to the embodiment. In the simulation, the first magnetic layer 11a is a magnetization free layer, and the first opposed magnetic layer 11b is a reference layer. The detection target magnetic field Ht along the first direction D1 and the magnetic field along the third direction D3 are applied to the first magnetic element 11. In the simulation, these magnetic fields do not include DC components. When these magnetic fields are applied, the orientation of the magnetization 11aM of the first magnetic layer 11a and the orientation of the magnetization 11bM of the first opposed magnetic layer 11b are calculated. Magnetic resistance is calculated based on the angle of the orientation of these magnetizations.

The horizontal axis of FIG. 16A is the magnetic field strength Has of the magnetic field along the third direction D3. The magnetic field strength Has is normalized by the anisotropic magnetic field Hk of the magnetization free layer. The vertical axis of FIG. 16A is the magnetic resistance MR1. The magnetic resistance MR1 is normalized by the maximum value of the magnetic resistance. FIG. 16A shows values at various normalized detection target magnetic fields Hts. The normalized detection target magnetic field Hts is normalized by the anisotropic magnetic field Hk of the magnetization free layer.

In FIG. 16A, the magnetic resistance MR1 when the normalized detection target magnetic field Hts is 0.0001 corresponds to the magnetic resistance when the detection target magnetic field Ht is not substantially applied to the first magnetic element 11. At this time, when the magnetic field strength Has of the magnetic field along the third direction D3 increases, the magnetic resistance MR1 increases. When the magnetic field strength Has of the magnetic field along the third direction D3 is 1 or more, the magnetic resistance MR1 is saturated.

As shown in FIG. 16A, the change in the magnetic resistance MR1 becomes gentle as the normalized detection target magnetic field Hts increases. For example, when the magnetic field strength Has of the magnetic field along the third direction D3 is 1.5, the magnetic resistance MR1 changes greatly according to the normalized detection target magnetic field Hts. By utilizing such characteristics, the detection target magnetic field Ht can be detected with high sensitivity by detecting the magnetic resistance.

In FIG. 16B, the values of some parameters are shown in the same graph as in FIG. 16A. When the detection target magnetic field Ht along the first direction D1 is zero (Hts=0.0001 in FIG. 16B), the saturation value of the magnetic resistance MR1 is set to 1. When the detection target magnetic field Ht is zero, the magnetic field strength at which the magnetic resistance MR1 is 0.9 is defined as a first magnetic field value Hs1. The first magnetic field value Hs1 is the first polarity (positive in this example). The first magnetic field value Hs1 corresponds to, for example, an approximate saturated magnetic field. In the embodiment, the absolute value of the local minimum value Hmin (see FIG. 15B) of the first magnetic field Ha is preferably larger than the absolute value of the first magnetic field value Hs1.

That is, in the embodiment, for example, it is preferable that following relation is satisfied:

$$Hd1-Hp/2>Hs1.$$

Under such a condition, the detection target magnetic field Ht can be efficiently detected with higher sensitivity.

In a state where the detection target magnetic field Ht along the first direction D1 is not applied to the first magnetic element 11, the electrical resistance of the first magnetic element 11 to which a magnetic field along the third direction D3 having the first magnetic field value Hs1 of the first polarity is applied, is 0.9 times the saturated electrical resistance (saturation value of the magnetic resistance MR1). The saturated electrical resistance is the saturation value of the electrical resistance of the first magnetic element 11 when the magnetic field along the third direction D3 increases.

In the embodiment, the local minimum value of the first current i1 corresponds to the difference between the DC component id1 of the first current i1 and ½ of the amplitude ip1 of the AC component ia1. This difference (absolute value of the local minimum value of the first current i1) is preferably larger than the absolute value of the first current value of the first polarity corresponding to the first magnetic field value Hs1. For example, in a state where the detection target magnetic field Ht along the first direction D1 is not applied to the first magnetic element 11, the electrical resistance of the first magnetic element 11 when a current having a first current value of the first polarity flows through the first conductive member 21 is 0.9 times the saturated electrical resistance. The saturated electrical resistance is the saturation value of the electrical resistance of the first magnetic element 11 when the current flowing through the first conductive member 21 increases. With such a first current i1, the detection target magnetic field Ht can be efficiently detected with higher sensitivity.

In the embodiment, a plurality of magnetic elements may be provided. By using the plurality of magnetic elements connected in a bridge, the detection target magnetic field Ht can be detected with higher accuracy.

Figure 17:
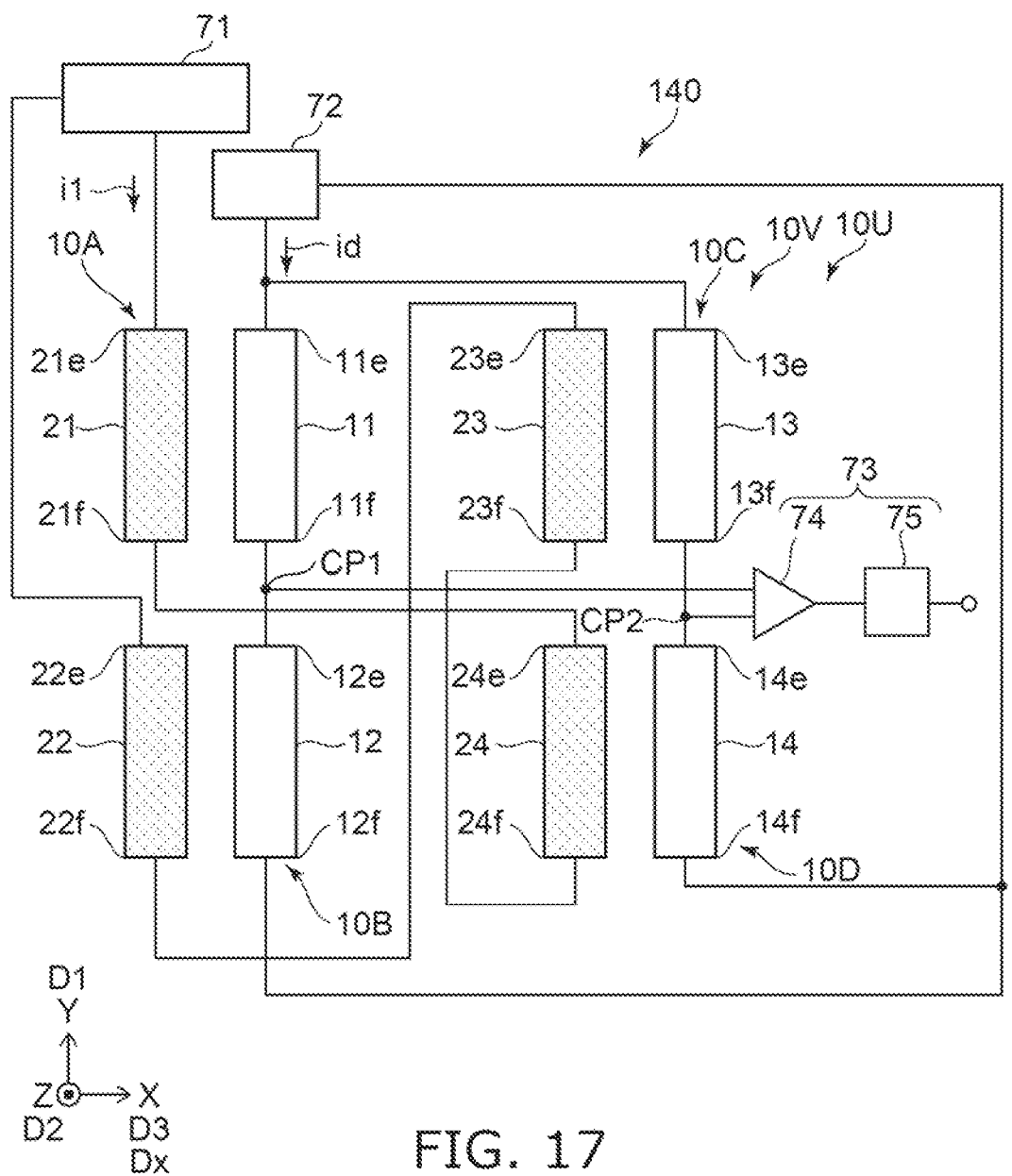
FIG. 17 is a schematic diagram illustrating the operation of the sensor according to the first embodiment.

FIG. 17 is a schematic diagram illustrating the operation of the sensor according to the first embodiment.

As shown in FIG. 17, in a sensor 140 according to the embodiment, the element portion 10U includes the first element 10A, a second element 10B, a third element 10C, and a fourth element 10D. The first element 10A includes the first magnetic element 11 and the first conductive member 21. The second element 10B includes a second magnetic element 12 and a second conductive member 22. The third element 10C includes a third magnetic element 13 and a third conductive member 23. The fourth element 10D includes a fourth magnetic element 14 and a fourth conductive member 24. The configuration of the second element 10B, the third element 10C, and the fourth element 10D may be the same as the configuration of the first element 10A.

As shown in FIG. 17, the first conductive member 21 includes the first conductive portion 21e and the first other conductive portion 21f. The direction from the first conductive portion 21e to the first other conductive portion 21f is along the first direction D1. The second conductive member 22 includes a second conductive portion 22e and a second other conductive portion 22f. A direction from the second conductive portion 22e to the second other conductive portion 22f is along the first direction D1. The third conductive member 23 includes a third conductive portion 23e and a third other conductive portion 23f. A direction from the third conductive portion 23e to the third other conductive portion 23f is along the first direction D1. A fourth conductive member 24 includes a fourth conductive portion 24e and a fourth other conductive portion 24f. The direction from the fourth conductive portion 24e to the fourth other conductive portion 24f is along the first direction D1.

The first magnetic element 11 includes a first element portion 11e and a first other element portion 11f. The first element portion 11e corresponds to the first conductive portion 21e. The first other element portion 11f corresponds to the first other conductive portion 21f. An orientation from the first element portion 11e to the first other element portion 11f is a first orientation.

The second magnetic element 12 includes a second element portion 12e and a second other element portion 12f. The second element portion 12e corresponds to the second conductive portion 22e. The second other element portion 12f corresponds to the second other conductive portion 22f. An orientation from the second element portion 12e to the second other element portion 12f is a second orientation.

The third magnetic element 13 includes a third element portion 13e and a third other element portion 13f. The third element portion 13e corresponds to the third conductive portion 23e. The third other element portion 13f corresponds to the third other conductive portion 23f. An orientation from the third element portion 13e to the third other element portion 13f is the third orientation.

The fourth magnetic element 14 includes a fourth element portion 14e and a fourth other element portion 14f. The fourth element portion 14e corresponds to the fourth conductive portion 24e. The fourth other element portion 14f corresponds to the fourth other conductive portion 24f. An orientation from the fourth element portion 14e to the fourth other element portion 14f is the fourth orientation.

The first element portion 11e is electrically connected to the second circuit 72. The first other element portion 11f is electrically connected to the second element portion 12e. The second other element portion 12f is electrically connected to the second circuit 72.

The third element portion 13e is electrically connected to the second circuit 72. The third other element portion 13f is electrically connected to the fourth element portion 14e. The fourth other element portion 14f is electrically connected to the second circuit 72.

The detection current id flows through the first magnetic element 11 in the first orientation, flows through the second magnetic element 12 in the second orientation, flows through the third magnetic element 13 in the third orientation, and flows through the fourth magnetic element 14 in the fourth orientation.

In this example, the first conductive portion 21e is electrically connected to the first circuit 71. The first other conductive portion 21f is electrically connected to the fourth conductive portion 24e. The fourth other conductive portion 24f is electrically connected to the third other conductive portion 23f. The third conductive portion 23e is electrically connected to the second other conductive portion 22f. The second conductive portion 22e is electrically connected to the first circuit 71.

When the first current i1 supplied from the first circuit 71 flows through the first conductive member 21 in the first orientation, the first current i1 flows through the second conductive member 22 in the orientation opposite to the second orientation, the first current i1 flows through the third conductive member 23 in the orientation opposite to the third orientation, and the first current i1 flows through the fourth conductive member 24 in the fourth orientation.

A first connection point CP1 is a connection point between the first other element portion 11f and the second element portion 12e. A second connection point CP2 is a connection point between the third other element portion 13f and the fourth element portion 14e.

As described above, the element portion 10U may include a bridge circuit 10V including the plurality of elements (first to fourth elements 10A to 10D, etc.). The second circuit 72 is configured to supply the detection current id to the bridge circuit 10V. The third circuit 73 is configured to detect a value a value corresponding to a difference between a potential of a first midpoint of the bridge circuit 10V (for example, the first connection point CP1) and a potential of a second midpoint of the bridge circuit 10V (for example, the second connection point CP2).

In the plurality of elements (first to fourth elements 10A to 10D, etc.), the first to ninth structures CF1 to CF9 may be included.

Second Embodiment

The second embodiment relates to an inspection device. As will be described later, the inspection device may include a diagnostic device.

Figure 18:
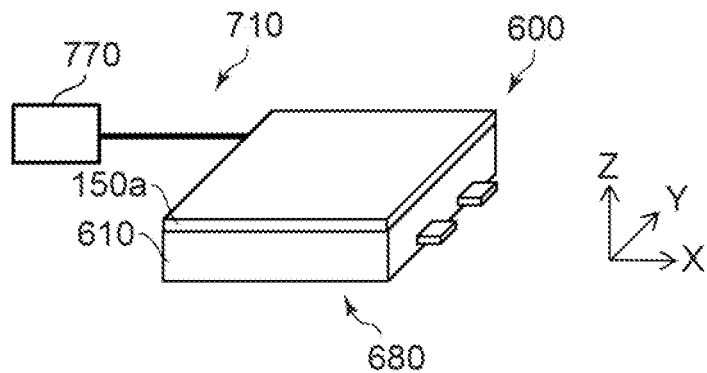
FIG. 18 is a schematic perspective view showing an inspection device according to a second embodiment.

FIG. 18 is a schematic perspective view illustrating an inspection device according to a second embodiment.

As shown in FIG. 18, an inspection device 710 according to the embodiment includes a sensor 150a (magnetic sensor) and a processor 770. The sensor 150a may be the sensor according to the first embodiment and a modification thereof. The processor 770 processes an output signal obtained from the sensor 150a. The processor 770 may compare the signal obtained from the sensor 150a with the reference value. The processor 770 can output the inspection result based on the processing result.

For example, the inspection device 710 inspects an inspection object 680. The inspection object 680 is, for example, an electronic device (including a semiconductor circuit or the like). The inspection object 680 may be, for example, a battery 610 or the like.

For example, the sensor 150a according to the embodiment may be used together with the battery 610. For example, a battery system 600 includes the battery 610 and the sensor 150a. The sensor 150a can detect the magnetic field generated by the current flowing through the battery 610.

Figure 19:
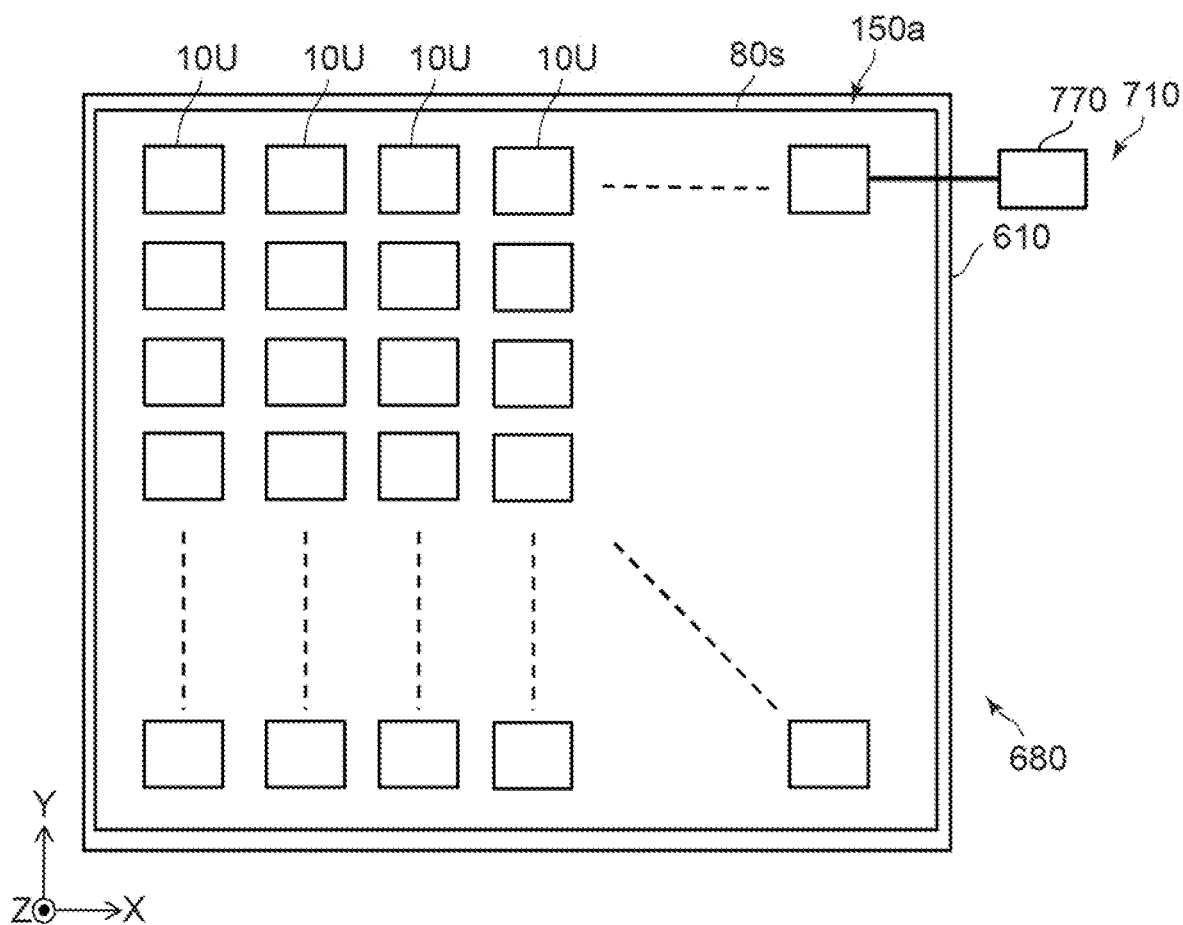
FIG. 19 is a schematic plan view showing the inspection device according to the second embodiment.

FIG. 19 is a schematic plan view illustrating the inspection device according to the second embodiment.

As shown in FIG. 19, the sensor 150a includes, for example, multiple sensors according to the embodiment. In this example, the sensor 150a includes multiple sensors (the element portion 10U such as the sensor 110, etc.). The multiple sensors are arranged along, for example, two directions (for example, the X-axis direction and the Y-axis direction). The multiple sensors 110 are provided, for example, on a substrate.

The sensor 150a can detect the magnetic field generated by the current flowing through the inspection object 680 (for example, the battery 610 may be used). For example, when the battery 610 approaches an abnormal state, an abnormal current may start to flow through the battery 610. By detecting the abnormal current with the sensor 150a, it is possible to know the change in the state of the battery 610. For example, in a state where the sensor 150a is placed close to the battery 610, the entire battery 610 can be inspected in a short time by moving the sensor array in two directions. The sensor 150a may be used for inspection of the battery 610 in manufacturing process of the battery 610.

The sensor according to the embodiment can be applied to, for example, the inspection device 710 such as a diagnostic device.

Figure 20:
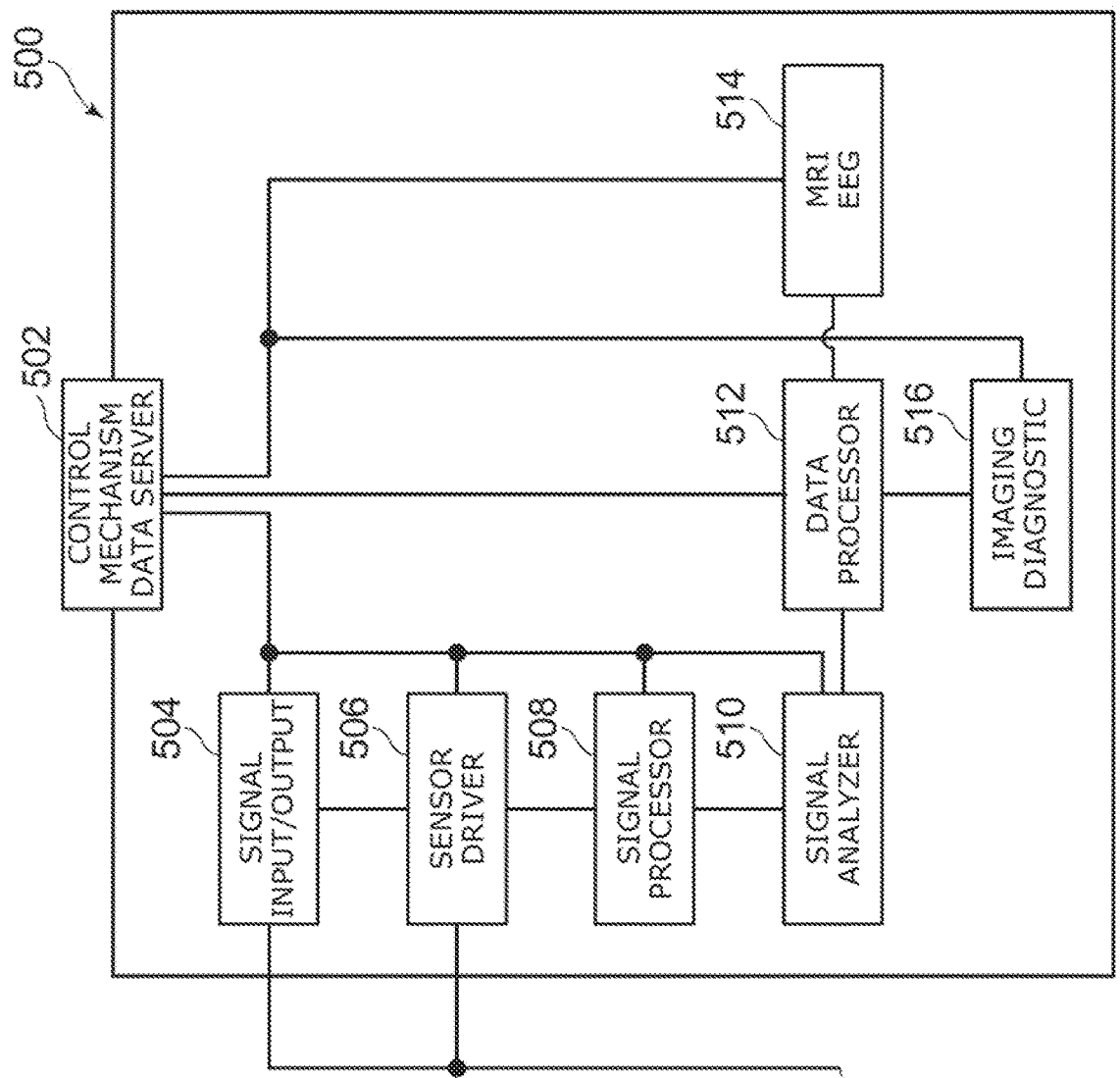
FIG. 20 is a schematic diagram showing a sensor and an inspection device according to an embodiment.

FIG. 20 is a schematic view illustrating the sensor and the inspection device according to the embodiment.

As shown in FIG. 20, a diagnostic apparatus 500, which is an example of the inspection device 710, includes a sensor 150. The sensor 150 includes the sensors described with respect to the first embodiment and modifications thereof.

In the diagnostic apparatus 500, the sensor 150 is, for example, a magnetoencephalograph. The magnetoencephalograph detects the magnetic field generated by the cranial nerves. When the sensor 150 is used in a magnetoencephalograph, the size of the magnetic element included in the sensor 150 is, for example, not less than 1 mm and less than 10 mm. This size is, for example, the length including an MFC.

As shown in FIG. 20, the sensor 150 (magnetoencephalogram) is attached to, for example, the head of a human body. The sensor 150 (magnetoencephalogram) includes a sensor part 301. The sensor 150 (magnetoencephalogram) may include multiple sensor parts 301. The number of the multiple sensor parts 301 is, for example, about 100 (for example, not less than 50 and not more than 150). The multiple sensor parts 301 are provided on a flexible base body 302.

The sensor 150 may include, for example, a circuit such as differential detection. The sensor 150 may include a sensor other than the sensor (for example, a potential terminal or an acceleration sensor).

A size of the sensor 150 is smaller than a size of a conventional SQUID sensor. Therefore, it is easy to install the multiple sensor parts 301. Installation of the multiple sensor parts 301 and other circuits is easy. The coexistence of the multiple sensor parts 301 and other sensors is easy.

The base body 302 may include an elastic body such as a silicone resin. For example, the multiple sensor parts 301 are provided to be connected to the base body 302. The base body 302 can be in close contact with the head, for example.

The input/output code 303 of the sensor part 301 is connected to a sensor driver 506 and a signal input/output 504 of the diagnostic apparatus 500. The magnetic field measurement is performed in the sensor part 301 based on the electric power from the sensor driver 506 and the control signal from the signal input/output 504. The result is input to the signal input/output 504. The signal obtained by the signal input/output 504 is supplied to a signal processor 508. The signal processor 508 performs processing such as noise removal, filtering, amplification, and signal calculation. The signal processed by the signal processor 508 is supplied to a signal analyzer 510. The signal analyzer 510 extracts, for example, a specific signal for magnetoencephalography measurement. In the signal analyzer 510, for example, signal analysis for matching signal phases is performed.

The output of the signal analyzer 510 (data for which signal analysis has been completed) is supplied to a data processor 512. The data processor 512 performs data analysis. In this data analysis, for example, image data such as MRI (Magnetic Resonance Imaging) can be incorporated. In this data analysis, for example, scalp potential information such as EEG (Electroencephalogram) can be incorporated. For example, a data part 514 such as MRI or EEG is connected to the data processor 512. By the data analysis, for example, nerve ignition point analysis, inverse problem analysis, and the like are performed.

The result of the data analysis is supplied to, for example, an imaging diagnostic 516. Imaging is performed in the imaging diagnostic 516. Imaging assists in diagnosis.

The above series of operations is controlled by, for example, a control mechanism 502. For example, necessary data such as primary signal data or metadata in the middle of data processing is stored in the data server. The data server and the control mechanism may be integrated.

The diagnostic apparatus 500 according to the embodiment includes the sensor 150 and the processor that processes an output signal obtained from the sensor 150. This processor includes, for example, at least one of a signal processor 508 or a data processor 512. The processor includes, for example, a computer.

In the sensor 150 shown in FIG. 20, the sensor part 301 is installed on the head of the human body. The sensor part 301 may be installed on the chest of the human body. This enables magnetocardiography measurement. For example, the sensor part 301 may be installed on the abdomen of a pregnant woman. This makes it possible to perform a fetal heartbeat test.

The sensor device including the subject is preferably installed in a shield room. Thereby, for example, the influence of geomagnetism or magnetic noise can be suppressed.

For example, a mechanism for locally shielding the measurement site of the human body or the sensor part 301 may be provided. For example, the sensor part 301 may be provided with a shield mechanism. For example, effective shielding may be performed in the signal analysis or the data processing.

In embodiments, the base body 302 may be flexible and may be substantially non-flexible. In the example shown in FIG. 20, the base body 302 is a continuous film processed into a hat shape. The base body 302 may be in a net shape. Thereby, for example, good wearability can be obtained. For example, the adhesion of the base body 302 to the human body is improved. The base body 302 may be helmet-shaped and may be rigid.

Figure 21:
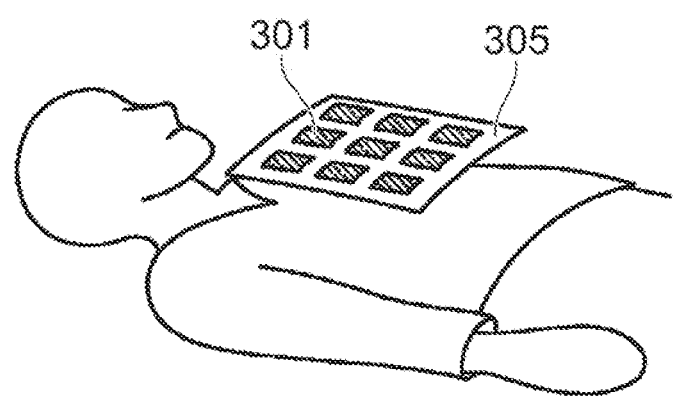
FIG. 21 is a schematic diagram showing an inspection device according to an embodiment.

FIG. 21 is a schematic view illustrating the inspection device according to the embodiment.

FIG. 21 is an example of a magnetocardiograph. In the example shown in FIG. 21, the sensor part 301 is provided on a flat plate-shaped hard base body 305.

In the example shown in FIG. 21, the input/output of the signal obtained from the sensor part 301 is the same as the input/output described with respect to FIG. 20. In the example shown in FIG. 21, the processing of the signal obtained from the sensor part 301 is the same as the processing described with respect to FIG. 20.

There is a reference example of using a SQUID (Superconducting Quantum Interference Device) sensor as a device for measuring a weak magnetic field such as a magnetic field generated from a living body. In this reference example, since superconductivity is used, the device is large and the power consumption is also large. The burden on the measurement target (patient) is heavy.

According to the embodiment, the device can be downsized. Power consumption can be suppressed. The burden on the measurement object (patient) can be reduced. According to the embodiment, the SN ratio of magnetic field detection can be improved. Sensitivity can be improved.

The embodiments may include the following configurations (for example, technical proposals).

(Configuration 1)

A sensor, comprising:
a first element, the first element, including:
a first magnetic member;
a second magnetic member, the second magnetic member being separated from the first magnetic member in a first direction from the first magnetic member to the second magnetic member;
an insulating member including a first insulating region, the first insulating region being provided between the first magnetic member and the second magnetic member;
a first wiring including a first connecting region;
a second wiring including a second connecting region;
a first magnetic element including a first magnetic layer and a first opposed magnetic layer, a second direction from the first magnetic layer to the first opposed magnetic layer crossing the first direction, a length of the first magnetic element along the first direction being longer than a length of the first magnetic element along a third direction crossing a plane including the first direction and the second direction, the first magnetic element including a first partial region, a second partial region, a third partial region, a fourth partial region, and a fifth partial region, the first partial region being between the fourth partial region and the fifth partial region in the first direction, the second partial region being between the fourth partial region and the first partial region in the first direction, the third partial region being between the first partial region and the fifth partial region in the first direction, a direction from the first partial region to the first insulating region being along the second direction, a direction from the second partial region to the first connecting region being along the second direction, the second partial region being electrically connected to the first connecting region, a direction from the third partial region to the second connecting region being along the second direction, the third partial region being electrically connected to the second connecting region, a direction from the fourth partial region to at least a part of the first magnetic member being along the second direction, a direction from the fifth partial region to at least a part of the second magnetic member being along the second direction; and
a first conductive member extending in the first direction, a direction from the first conductive member to the first magnetic element being along the second direction.

(Configuration 2)

The sensor according to Configuration 1, wherein the first connecting region overlaps the first magnetic member in the second direction, and the second connecting region overlaps the second magnetic member in the second direction.

(Configuration 3)

The sensor according to Configuration 1 or 2, wherein a part of the first connecting region overlaps the first insulating region in the second direction, and a part of the second connecting region overlaps the first insulating region in the second direction.

(Configuration 4)

A sensor, comprising:
a first element, the first element, including:
a first magnetic member;
a second magnetic member, the second magnetic member being separated from the first magnetic member in a first direction from the first magnetic member to the second magnetic member;
an insulating member including a first insulating region, the first insulating region being provided between the first magnetic member and the second magnetic member;
a first wiring including a first connecting region;
a second wiring including a second connecting region;
a first magnetic element including a first magnetic layer and a first opposed magnetic layer, a second direction from the first magnetic layer to the first opposed magnetic layer crossing the first direction, a length of the first magnetic element along the first direction being longer than a length of the first magnetic element along a third direction crossing a plane including the first direction and the second direction, the first magnetic element including a first partial region, a direction from the first partial region to the first insulating region being along the second direction, the first connecting region being electrically connected to a part of the first partial region, the second connecting region being electrically connected to an other part of the first partial region, a direction from the part of the first partial region to the other part of the first partial region including a component of the third direction; and
a first conductive member extending in the first direction, a direction from the first conductive member to the first magnetic element being along the second direction.

(Configuration 5)

The sensor according to Configuration 4, wherein
the first magnetic element includes a second partial region and a third partial region,
the first partial region being between the second partial region and the third partial region in the first direction,
the second partial region overlaps the first connecting region in the second direction, and
the third partial region overlaps the second connecting region in the second direction.

(Configuration 6)

The sensor according to any one of Configurations 1-5, wherein
the first magnetic element includes a first non-magnetic layer provided between the first magnetic layer and the first opposed magnetic layer, and
the first non-magnetic layer includes at least one selected from the group consisting of Cu, Au and Ag.

(Configuration 7)

The sensor according to any one of Configurations 1-6, wherein
a part of the first magnetic layer is located between a part of the first magnetic layer and the first connecting region in the second direction, and
an other part of the first magnetic layer is located between the other part of the first magnetic layer and the second connecting region in the second direction.

(Configuration 8)

A sensor, comprising:
a first element, the first element, including:
a first magnetic member;
a second magnetic member, the second magnetic member being separated from the first magnetic member in a first direction from the first magnetic member to the second magnetic member;
an insulating member including a first insulating region, the first insulating region being provided between the first magnetic member and the second magnetic member;
a first wiring including a first connecting region;
a second wiring including a second connecting region;
a first magnetic element including a first magnetic layer and a first opposed magnetic layer, a second direction from the first magnetic layer to the first opposed magnetic layer crossing the first direction, a length of the first magnetic element along the first direction being longer than a length of the first magnetic element along a third direction crossing a plane including the first direction and the second direction, the first magnetic element including a first partial region, the first partial region being between the second connecting region and the first insulation region, the first connecting region being between the first partial region and the first insulation region, the first connecting region being electrically connected to one of the first magnetic layer and the first opposed magnetic layer, the second connecting region being electrically connected to an other of the first magnetic layer and the first opposed magnetic layer; and
a first conductive member extending in the first direction, a direction from the first conductive member to the first magnetic element being along the second direction.

(Configuration 9)

The sensor according to Configuration 8, wherein
the first magnetic element further includes a second partial region and a third partial region,
the first partial region is located between the second partial region and the third partial region in the first direction,
a direction from the second partial region to the first magnetic member is along the second direction, and
a direction from the third partial region to the second magnetic member is along the second direction.

(Configuration 10)

The sensor according to Configuration 9, wherein
a part of the second partial region overlaps at least one of the first connecting region or the second connecting region in the second direction, and
a part of the third partial region overlaps at least one of the first connecting region or the second connecting region in the second direction.

(Configuration 11)

The sensor according to Configuration 10, wherein
the first magnetic element further includes a fourth partial region and a fifth partial region,
the first partial region is located between the fourth partial region and the fifth partial region in the first direction,
the second partial region is located between the fourth partial region and the first partial region in the first direction,
the third partial region is located between the first partial region and the fifth partial region in the first direction,
the fourth partial region does not overlap the first connecting region and the second connecting region in the second direction, and
the fifth partial does not overlap the first connecting region and the second connecting region in the second direction.

(Configuration 12)

The sensor according to any one of Configurations 8-11, wherein
the first magnetic element includes a first non-magnetic layer provided between the first magnetic layer and the first opposed magnetic layer, and
the first non-magnetic layer includes oxygen and at least one selected from the group consisting of Mg, Al, Ta and Ti.

(Configuration 13)

The sensor according to any one of Configurations 1-12, wherein
the first magnetic member includes a first portion and a first other portion, the first portion is located between the first insulating region and the first other portion in the first direction, and
a width of the first portion along the third direction is narrower than a width of the first other portion along the third direction.

(Configuration 14)

The sensor according to Configuration 13, wherein
the first conductive member includes a first conductive region,
the first conductive region overlaps the first portion in the second direction, and
a width of the first conductive region along the third direction is wider than the width of the first portion along the third direction, and is narrower than the width of the first other portion along the third direction.

(Configuration 15)

The sensor according to any one of Configurations 1-14, further comprising:
a third magnetic member; and
a fourth magnetic member,
the fourth magnetic member being separated from the third magnetic member in the third direction, the first insulating region being provided between the third magnetic member and the fourth magnetic member.
(Configuration 16)

The sensor according to Configuration 15, wherein
the third magnetic member includes a third portion and a third other portion, the third portion is located between the first insulating region and the third other portion in the third direction, and
a width of the third portion along the first direction is narrower than a width of the third other portion along the first direction.
(Configuration 17)

The sensor according to any one of Configurations 1-16, further comprising a controller including a first circuit,
the first conductive member including a first conductive portion and a first other conductive portion, a direction from the first other conductive portion to the first conductive portion being along the first direction,
the first circuit being electrically connected to the first conductive portion and the first other conductive portion, and
the first circuit being configured to supply a first current including an alternating current component to the first conductive member.
(Configuration 18)

The sensor according to Configuration 17, wherein the controller includes
a second circuit configured to supply a detection current to the first magnetic element, and
a third circuit configured to detect a signal corresponding to a change in an electrical resistance of the first magnetic element.
(Configuration 19)

The sensor according to Configuration 17, wherein an electrical resistance of the first magnetic element changes according to a change of the first current.
(Configuration 20)

An inspection device, comprising:
the sensor according to any one of Configurations 1-19; and
a processer configured to process an output signal obtained from the sensor.

According to the embodiment, it is possible to provide a sensor and an inspection device capable of improving the characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the sensors and inspection devices such as magnetic layers, magnetic elements, conductive members, controllers, processers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and all inspection devices practicable by an appropriate design modification by one skilled in the art based on the sensors and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A sensor, comprising:
a first element, the first element, including:
a first magnetic member;
a second magnetic member, the second magnetic member being separated from the first magnetic member in a first direction from the first magnetic member to the second magnetic member;
an insulating member including a first insulating region, the first insulating region being provided between the first magnetic member and the second magnetic member;
a first wiring including a first connecting region;
a second wiring including a second connecting region;
a first magnetic element including a first magnetic layer and a first opposed magnetic layer, a second direction from the first magnetic layer to the first opposed magnetic layer crossing the first direction, a length of the first magnetic element along the first direction being longer than a length of the first magnetic element along a third direction crossing a plane including the first direction and the second direction, the first magnetic element including a first partial region, a second partial region, a third partial region, a fourth partial region, and a fifth partial region, the first partial region being between the fourth partial region and the fifth partial region in the first direction, the second partial region being between the fourth partial region and the first partial region in the first direction, the third partial region being between the first partial region and the fifth partial region in the first direction, a direction from the first partial region to the first insulating region being along the second direction, a direction from the second partial region to the first connecting region being along the second direction, the second partial region being electrically connected to the first connecting region, a direction from the third partial region to the second connecting region being along the second direction, the third partial region being electrically connected to the second connecting region, a direction from the fourth partial region to at least a part of the first magnetic member being along the second direction, a direction from the fifth partial region to at least a part of the second magnetic member being along the second direction; and
a first conductive member extending in the first direction, a direction from the first conductive member to the first magnetic element being along the second direction.

2. The sensor according to claim 1, wherein
the first connecting region overlaps the first magnetic member in the second direction, and
the second connecting region overlaps the second magnetic member in the second direction.

3. The sensor according to claim 1, wherein
a part of the first connecting region overlaps the first insulating region in the second direction, and
a part of the second connecting region overlaps the first insulating region in the second direction.

4. The sensor according to claim 1, wherein
the first magnetic element includes a first non-magnetic layer provided between the first magnetic layer and the first opposed magnetic layer, and
the first non-magnetic layer includes at least one selected from the group consisting of Cu, Au and Ag.

5. The sensor according to claim 1, wherein
a part of the first magnetic layer is located between a part of the first magnetic layer and the first connecting region in the second direction, and
an other part of the first magnetic layer is located between the other part of the first magnetic layer and the second connecting region in the second direction.

6. An inspection device, comprising:
the sensor according to claim 1; and
a processer configured to process an output signal obtained from the sensor.

7. The sensor according to claim 1, wherein
the first magnetic member includes a first portion and a first other portion, the first portion is located between the first insulating region and the first other portion in the first direction, and
a width of the first portion along the third direction is narrower than a width of the first other portion along the third direction.

8. The sensor according to claim 7, wherein
the first conductive member includes a first conductive region,
the first conductive region overlaps the first portion in the second direction, and
a width of the first conductive region along the third direction is wider than the width of the first portion along the third direction, and is narrower than the width of the first other portion along the third direction.

9. The sensor according to claim 1, further comprising:
a third magnetic member; and
a fourth magnetic member,
the fourth magnetic member being separated from the third magnetic member in the third direction,
the first insulating region being provided between the third magnetic member and the fourth magnetic member.

10. The sensor according to claim 9, wherein
the third magnetic member includes a third portion and a third other portion, the third portion is located between the first insulating region and the third other portion in the third direction, and
a width of the third portion along the first direction is narrower than a width of the third other portion along the first direction.

11. The sensor according to claim 1, further comprising a controller including a first circuit,
the first conductive member including a first conductive portion and a first other conductive portion, a direction from the first other conductive portion to the first conductive portion being along the first direction,
the first circuit being electrically connected to the first conductive portion and the first other conductive portion, and
the first circuit being configured to supply a first current including an alternating current component to the first conductive member.

12. The sensor according to claim 11, wherein the controller includes
a second circuit configured to supply a detection current to the first magnetic element, and
a third circuit configured to detect a signal corresponding to a change in an electrical resistance of the first magnetic element.

13. The sensor according to claim 11, wherein an electrical resistance of the first magnetic element changes according to a change of the first current.

14. A sensor, comprising:
a first element, the first element, including:
a first magnetic member;
a second magnetic member, the second magnetic member being separated from the first magnetic member in a first direction from the first magnetic member to the second magnetic member;
an insulating member including a first insulating region, the first insulating region being provided between the first magnetic member and the second magnetic member;
a first wiring including a first connecting region;
a second wiring including a second connecting region;
a first magnetic element including a first magnetic layer and a first opposed magnetic layer, a second direction from the first magnetic layer to the first opposed magnetic layer crossing the first direction, a length of the first magnetic element along the first direction being longer than a length of the first magnetic element along a third direction crossing a plane including the first direction and the second direction, the first magnetic element including a first partial region, a direction from the first partial region to the first insulating region being along the second direction, the first connecting region being electrically connected to a part of the first partial region, the second connecting region being electrically connected to an other part of the first partial region, a direction from the part of the first partial region to the other part of the first partial region including a component of the third direction; and
a first conductive member extending in the first direction, a direction from the first conductive member to the first magnetic element being along the second direction.

15. The sensor according to claim 14, wherein
the first magnetic element includes a second partial region and a third partial region,
the first partial region being between the second partial region and the third partial region in the first direction,
the second partial region overlaps the first connecting region in the second direction, and
the third partial region overlaps the second connecting region in the second direction.

16. A sensor, comprising:
a first element, the first element, including:
a first magnetic member;
a second magnetic member, the second magnetic member being separated from the first magnetic member in a first direction from the first magnetic member to the second magnetic member;

an insulating member including a first insulating region, the first insulating region being provided between the first magnetic member and the second magnetic member;
a first wiring including a first connecting region;
a second wiring including a second connecting region;
a first magnetic element including a first magnetic layer and a first opposed magnetic layer, a second direction from the first magnetic layer to the first opposed magnetic layer crossing the first direction, a length of the first magnetic element along the first direction being longer than a length of the first magnetic element along a third direction crossing a plane including the first direction and the second direction, the first magnetic element including a first partial region, the first partial region being between the second connecting region and the first insulation region, the first connecting region being between the first partial region and the first insulation region, the first connecting region being electrically connected to one of the first magnetic layer and the first opposed magnetic layer, the second connecting region being electrically connected to an other of the first magnetic layer and the first opposed magnetic layer; and
a first conductive member extending in the first direction, a direction from the first conductive member to the first magnetic element being along the second direction.

17. The sensor according to claim 16, wherein
the first magnetic element includes a first non-magnetic layer provided between the first magnetic layer and the first opposed magnetic layer, and
the first non-magnetic layer includes oxygen and at least one selected from the group consisting of Mg, Al, Ta and Ti.

18. The sensor according to claim 16, wherein
the first magnetic element further includes a second partial region and a third partial region,
the first partial region is located between the second partial region and the third partial region in the first direction,
a direction from the second partial region to the first magnetic member is along the second direction, and
a direction from the third partial region to the second magnetic member is along the second direction.

19. The sensor according to claim 18, wherein
a part of the second partial region overlaps at least one of the first connecting region or the second connecting region in the second direction, and
a portion of the third partial region overlaps at least one of the first connecting region or the second connecting region in the second direction.

20. The sensor according to claim 19, wherein
the first magnetic element further includes a fourth partial region and a fifth partial region,
the first partial region is located between the fourth partial region and the fifth partial region in the first direction,
the second partial region is located between the fourth partial region and the first partial region in the first direction,
the third partial region is located between the first partial region and the fifth partial region in the first direction,
the fourth partial region does not overlap the first connecting region and the second connecting region in the second direction, and
the fifth partial does not overlap the first connecting region and the second connecting region in the second direction.

* * * * *